(12) United States Patent
Lee et al.

(10) Patent No.: US 7,432,199 B2
(45) Date of Patent: Oct. 7, 2008

(54) METHOD OF FABRICATING SEMICONDUCTOR DEVICE HAVING REDUCED CONTACT RESISTANCE

(75) Inventors: Sung-Tae Lee, Suwon-si (KR); Sun-Young Kim, Yongin-si (KR); Young-Soo Song, Incheon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 106 days.

(21) Appl. No.: 11/645,862

(22) Filed: Dec. 27, 2006

(65) Prior Publication Data

US 2008/0096358 A1    Apr. 24, 2008

(30) Foreign Application Priority Data

Oct. 20, 2006   (KR) ...................... 10-2006-0102572

(51) Int. Cl.
*H01L 21/4763*   (2006.01)
*H01L 21/44*     (2006.01)

(52) U.S. Cl. ...................... 438/672; 438/629; 438/669; 438/675; 257/E21.597; 257/E21.66

(58) Field of Classification Search .......... 257/E21.597, 257/E21.66
See application file for complete search history.

(56) References Cited

U.S. PATENT DOCUMENTS 7,361,591 B2 *   4/2008   Park ........................... 438/652

2002/0192868 A1*  12/2002  Kim ............................ 438/112
2005/0255658 A1   11/2005  Wang et al.
2006/0138463 A1*   6/2006  Kim et al. .................... 257/202
2006/0186485 A1*   8/2006  Cho et al. .................... 257/401

FOREIGN PATENT DOCUMENTS

| JP | 05102429     | 4/1993  |
|----|--------------|---------|
| JP | 09181277     | 7/1997  |
| JP | 11-297855    | 10/1999 |
| JP | 2004-095910  | 3/2004  |
| JP | 2005183914   | 7/2005  |
| KR | 1020040071527| 8/2004  |
| KR | 100614657    | 8/2006  |

OTHER PUBLICATIONS

English Abstract for Publication No. 05-102429.
English Abstract for Publication No. 09-181277.
English Abstract for Publication No. 2005-183914.

* cited by examiner

*Primary Examiner*—Scott B. Geyer
*Assistant Examiner*—Mohsen Ahmadi
(74) *Attorney, Agent, or Firm*—F. Chau & Associates, LLC

(57) ABSTRACT

Provided is a method for fabricating a semiconductor device having reduced contact resistance. In the method, gate patterns defining a narrow opening and a wide opening are formed having an upper portion of a predetermined region of a semiconductor substrate. After gate spacers are formed on sidewalls of the gate patterns, an ion implantation process that uses the gate patterns and the gate spacers as an ion mask is performed to form a plug doped region in a portion of the semiconductor substrate that is located below the wide opening. At this point, the gate spacers are formed to expose a portion of a bottom surface of the wide opening and to fill a lower portion of the narrow opening.

18 Claims, 26 Drawing Sheets

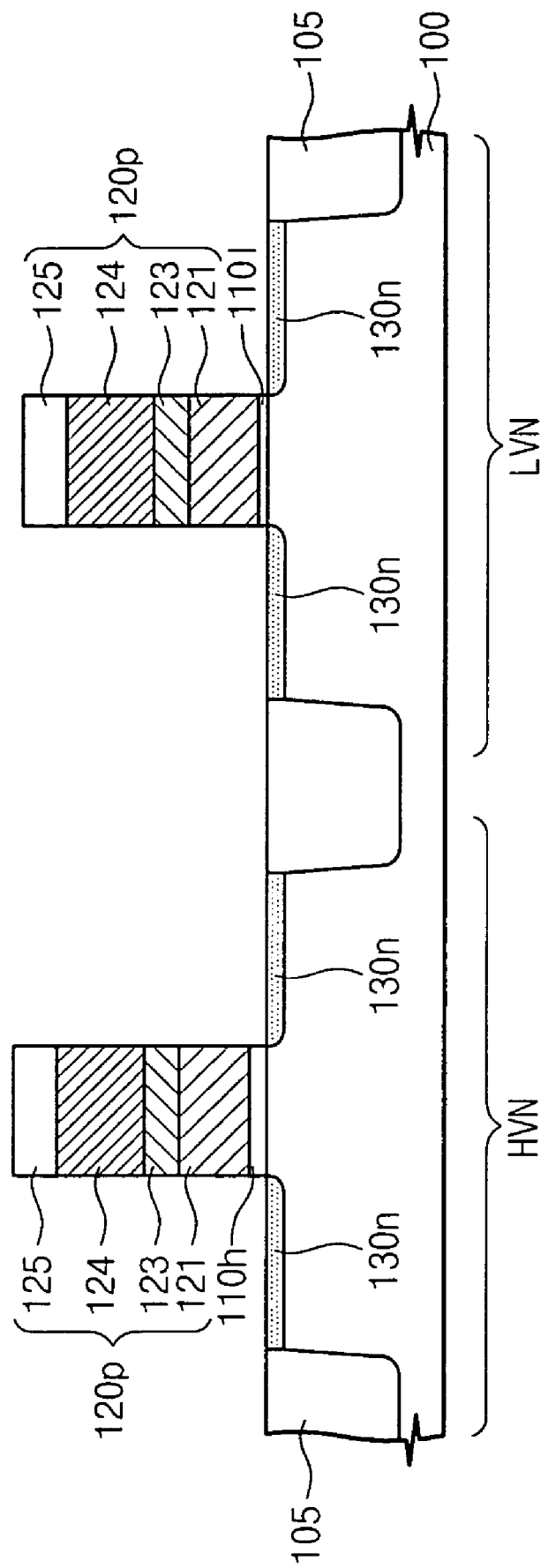

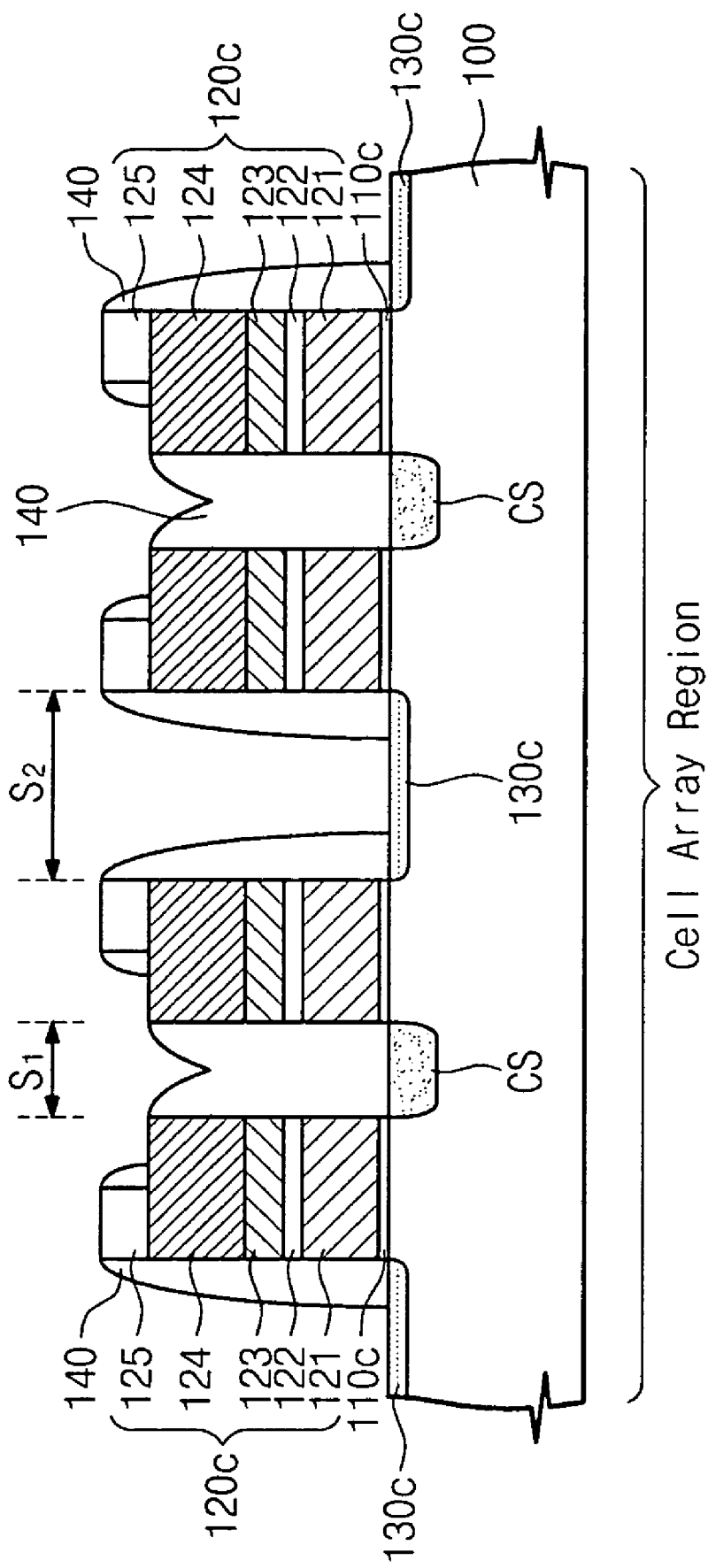

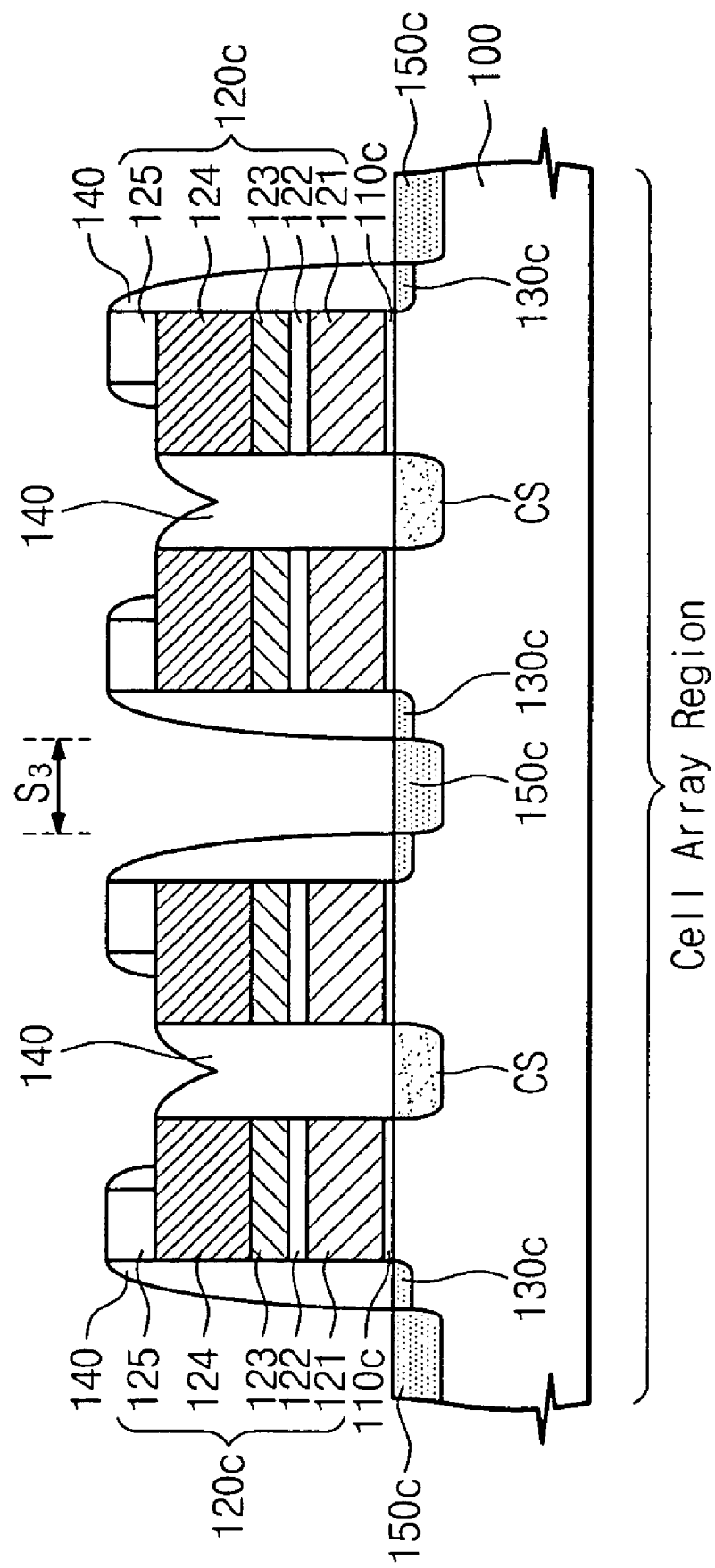

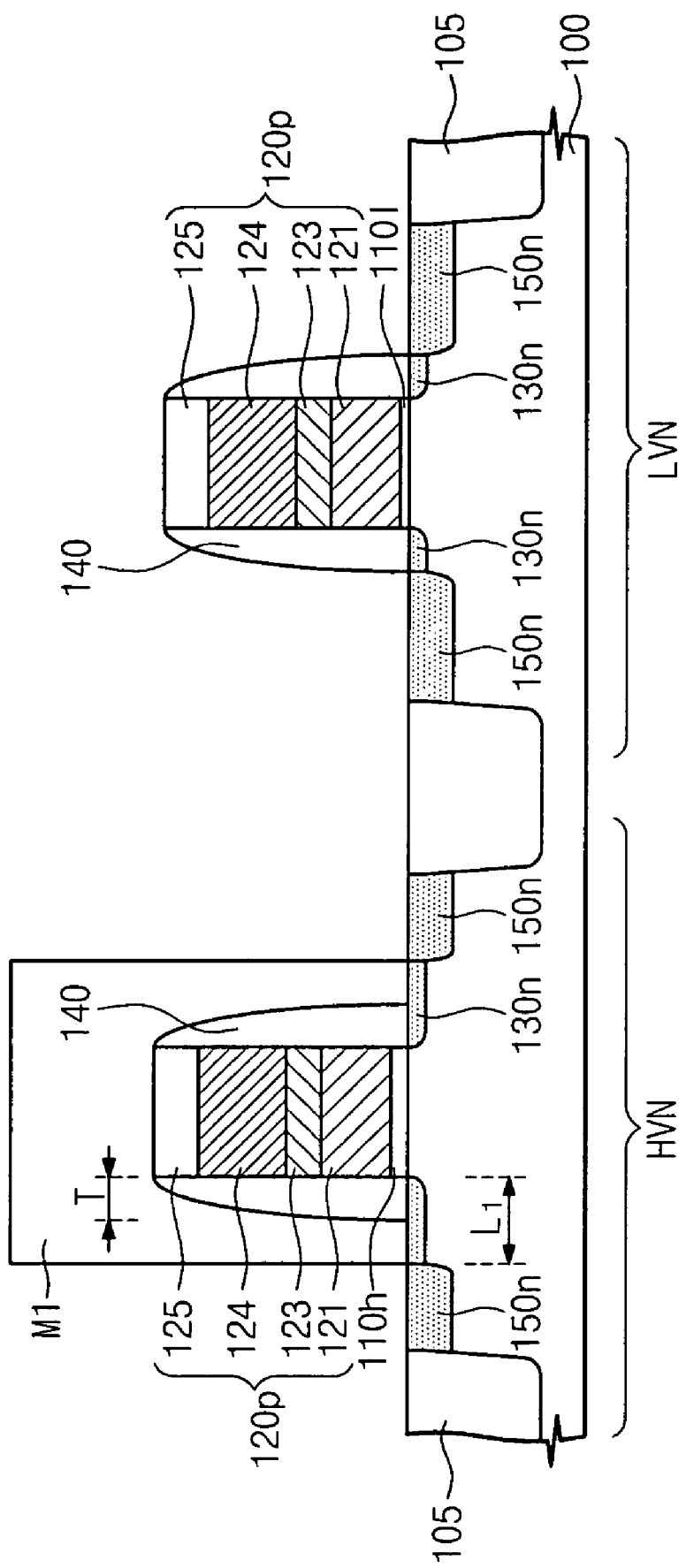

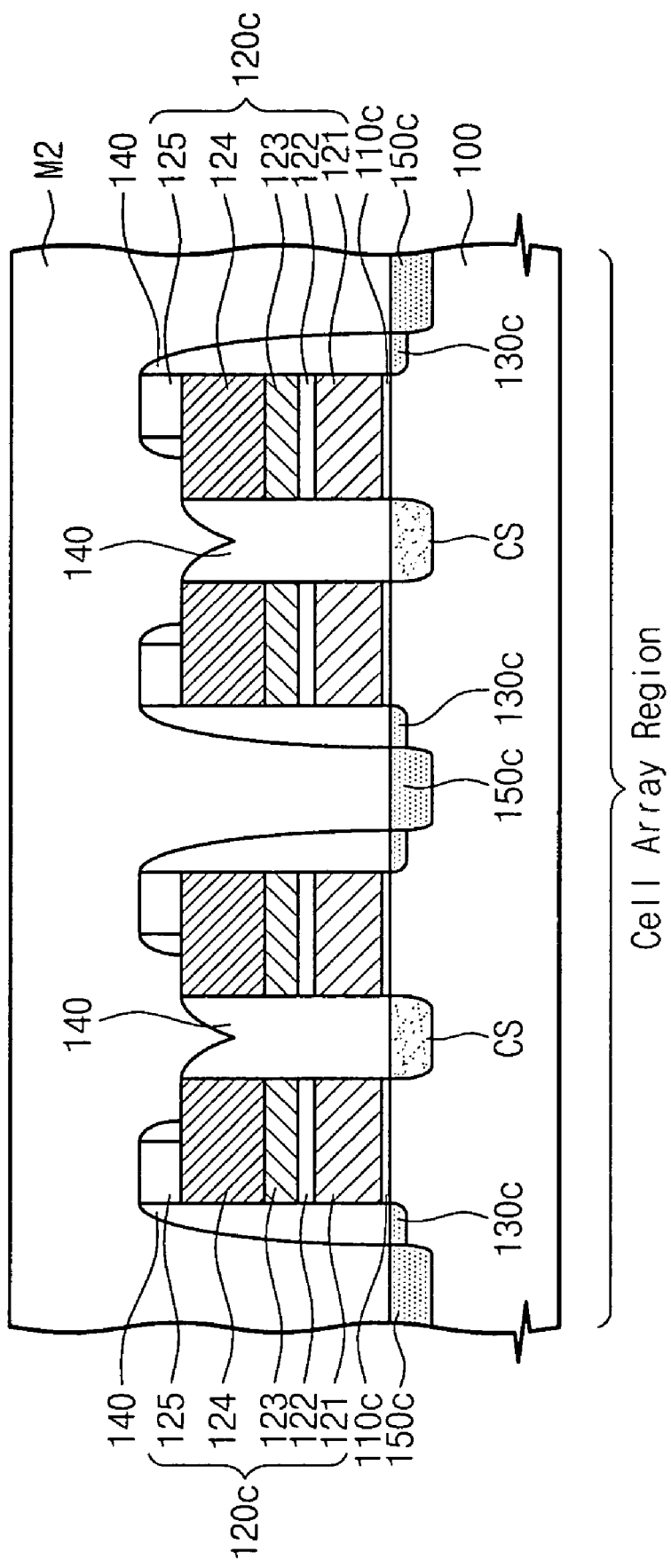

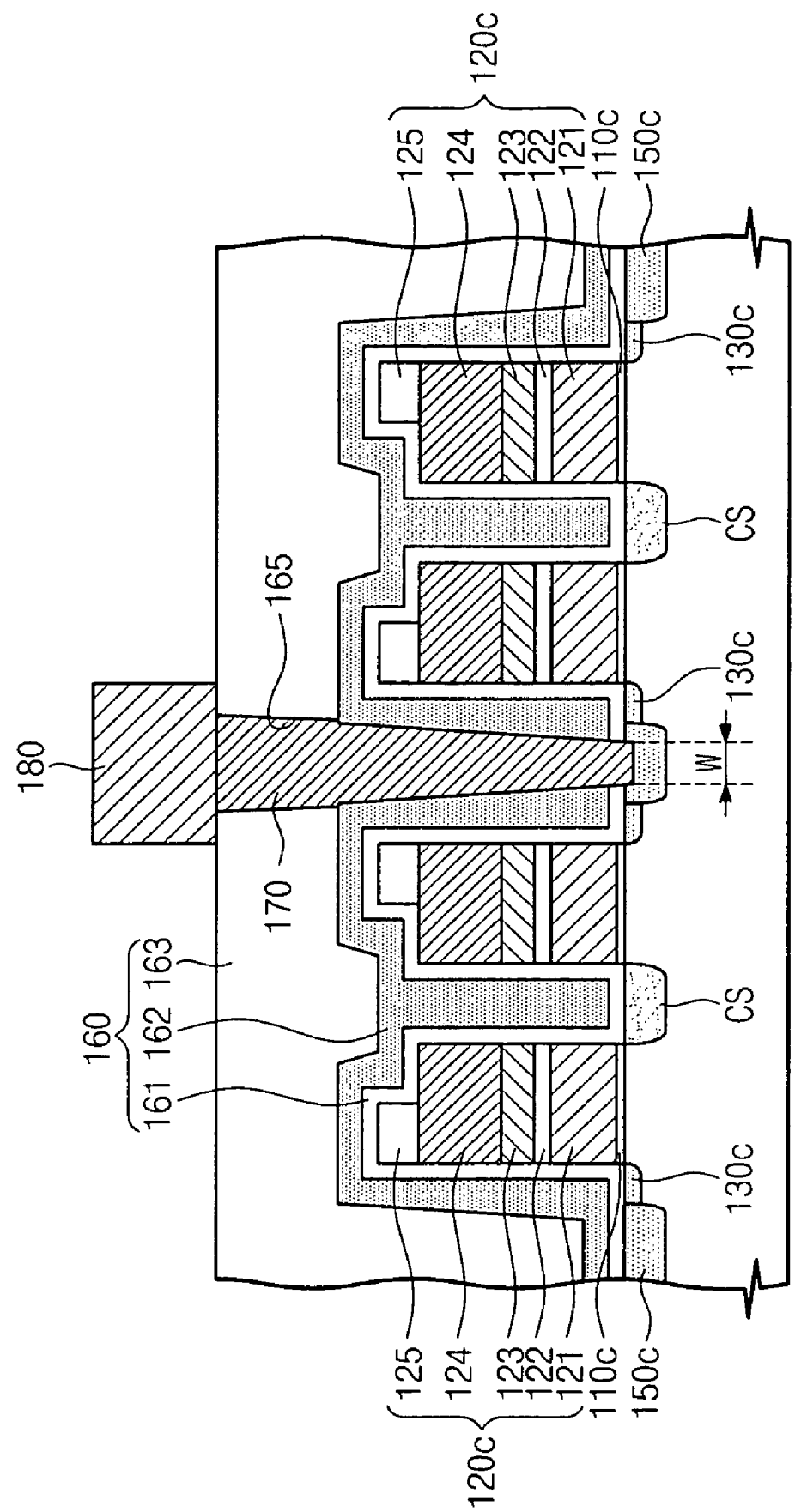

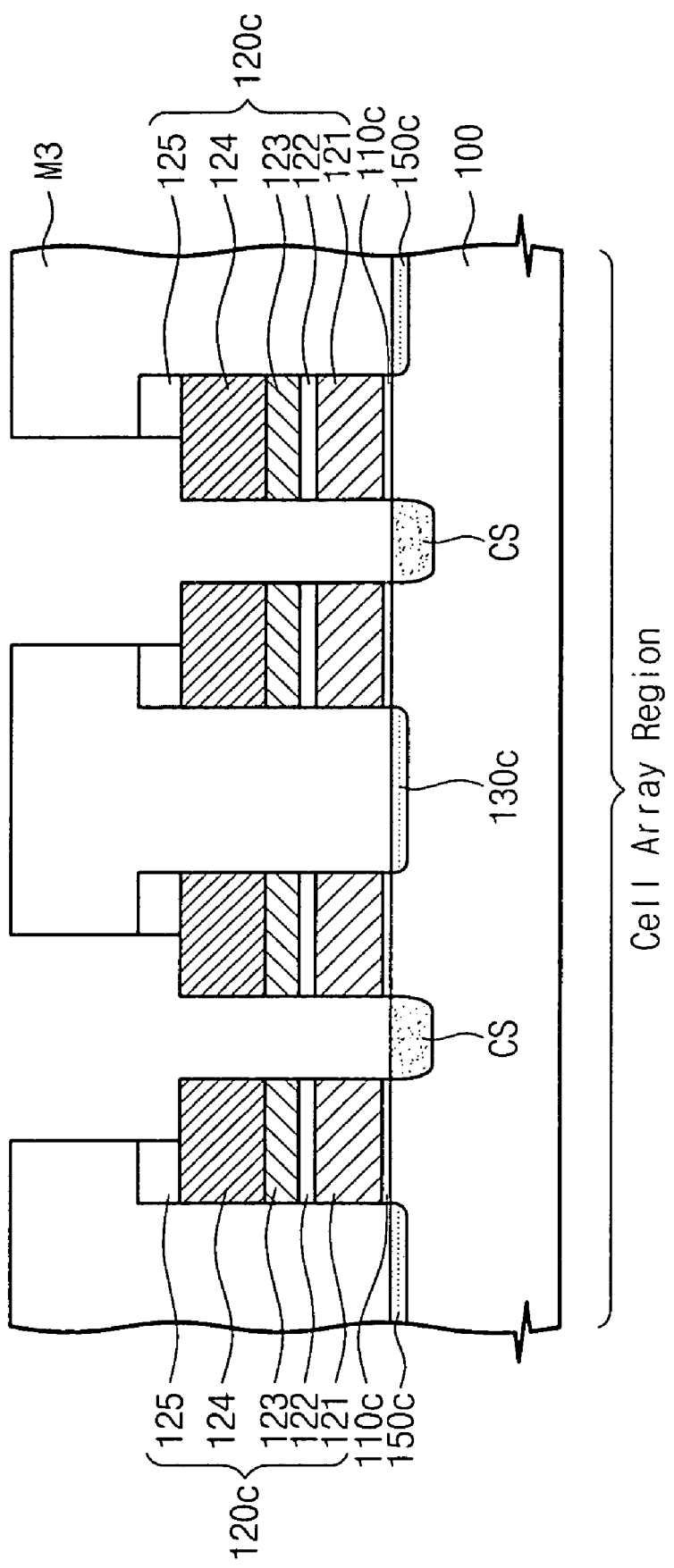

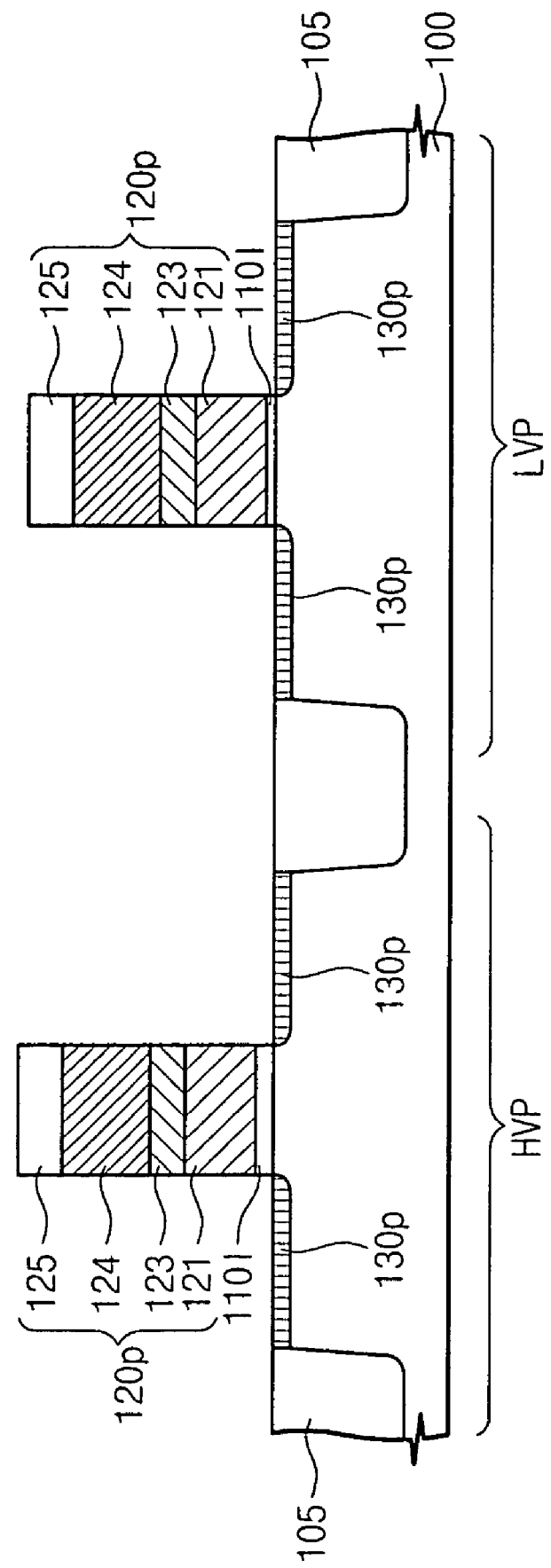

METHOD OF FABRICATING SEMICONDUCTOR DEVICE HAVING REDUCED CONTACT RESISTANCE

CROSS-REFERENCE TO RELATED APPLICATION

This application claims priority under 35 U.S.C. § 119 to Korean Patent Application No. 10-2006-0102572, filed on Oct. 20, 2006, the entire contents of which are hereby incorporated by reference.

BACKGROUND OF THE INVENTION

Technical Field

The present disclosure relates to a semiconductor device, and more particularly, to a method of fabricating a semiconductor device having reduced contact resistance.

A metal oxide semiconductor (MOS) device includes MOS field effect transistors (MOSFETs) formed on a semiconductor substrate and an interconnection structure connecting the MOSFETs. The interconnection structure includes contact plugs passing through ah interlayer insulating layer to contact gate, source, and drain electrodes of the MOSFETs. Local interconnection lines are disposed on the interlayer insulating layer to connect the contact plugs.

As semiconductor devices are more highly integrated, the dimensions of a MOSFET, a contact plug, and a local line are reduced. This results in difficulty in fabricating the semiconductor devices and degradation in semiconductor device characteristics. For example, reduction in the dimensions of the contact plug leads to an increase in electrical resistance of the contact plug. The increase in electrical resistance of the contact plug increases power consumption of a semiconductor device and reduces a data sensing margin. Consequently, product yield of a semiconductor device may be reduced.

Particularly, as semiconductor devices become highly integrated, line width reduces in one dimension while an area of a contact plug reduces in two dimensions. Consequently, electrical resistance of the contact plug is greatly influenced by an increase in integration of the semiconductor devices.

FIG. 1 is a flowchart explaining a process for reducing contact resistance of a contact plug according to a conventional approach. In particular, FIG. 1 illustrates a method for reducing contact resistance of a bit line contact plug of a flash memory device.

Referring to FIG. 1, cell transistors and peripheral transistors are formed on a semiconductor substrate including a cell array region and a peripheral circuit region (Step S10). In general, the cell transistors have an NMOSFET-based structure, and the peripheral transistors include negative MOSFETs (NMOSFETs) and positive MOSFETs (PMOSFETs), which are disposed in a negative MOS (NMOS) region and a positive MOS (PMOS) region, respectively. The cell transistors and the peripheral transistors are formed to include low concentration (that is, n− and p−) doped regions used as source/drain electrodes.

Subsequently, an n+ ion implantation process for forming n+ doped regions (used as source/drain electrodes of the NMOSFETs) in the NMOS region is performed (Step S11), and a p+ ion implantation process for forming p+ doped regions (used as source/drain electrodes of the PMOSFETs) in the PMOS region is performed (Step S12). At this point, since the p+ ion implanting process is performed using a first photoresist pattern covering the cell array region and the PMOS region, the n+ doped region is selectively formed in the NMOS region. Similarly, since the p+ ion implantation process is performed using a second photoresist pattern covering the cell array region and the NMOS region, the p+ doped region is selectively formed in the PMOS region.

Subsequently, an interlayer insulating layer covering the cell transistors and the peripheral transistors is formed (Step S13). The interlayer insulating layer is patterned to form contact holes exposing electrodes of the cell transistors and the peripheral transistors (Step S14). The contact holes are formed using a third photoresist pattern as an etch mask. The third photoresist pattern is formed by photolithography. After that, contact plugs are formed to fill the contact holes (Step S16).

Before the contact plugs are formed, an n+ ion implantation process may be performed to form a cell plug doped region in the cell array region of a semiconductor substrate exposed by the contact holes (Step S15). Since the cell array region has a narrower interval than the peripheral circuit region, a contact plug of the cell array region has large contact resistance. The cell plug doped region is formed reducing this large contact resistance. The cell plug doped region is formed using a fourth photoresist pattern as an ion mask preventing the cell plug doped region from being formed in the peripheral transistor region (particularly, in the PMOS region).

However, according to the above-described conventional approach, at least four iterations of photolithography are required from the step of forming transistors to the step of forming contact plugs. Since photolithography is expensive, reducing the number of photolithography steps reduces costs and time associated with fabricating semiconductor devices.

SUMMARY OF THE INVENTION

Exemplary embodiments of the present invention provide methods for fabricating a semiconductor device having reduced contact resistance.

Exemplary embodiments of the present invention also provide methods for fabricating a semiconductor device having reduced contact resistance through a reduced number of process steps.

Exemplary embodiments of the present invention provide methods for fabricating a semiconductor device, the methods comprise forming a plug doped region using a gate spacer as an ion mask. Gate patterns defining a narrow opening and a wide opening in an upper portion of a predetermined region of a semiconductor substrate are formed. Gate spacers are formed on sidewalls of the gate patterns. An ion implantation process that uses the gate patterns and the gate spacers as an ion mask is performed to form a plug doped region in a portion of the semiconductor substrate that is located below the wide opening. The gate spacers are formed to expose a portion of a bottom surface of the wide opening and to fill a lower portion of the narrow opening.

In some exemplary embodiments, the gate spacers filling the lower portion of the narrow opening are used as an ion mask during the ion implantation process. Accordingly, the plug doped region is not formed in a portion of the semiconductor substrate that is located below the narrow opening but selectively formed in a portion of the semiconductor substrate that is located below the wide opening.

In other exemplary embodiments, the forming of the gate spacers includes forming a spacer layer on a resulting structure where the gate patterns have been formed. Anisotropic etching is performed on the spacer layer until a bottom surface of the wide opening is exposed to form the gate spacers.

The spacer layer is formed with a thickness that is thicker than half of a width of the narrow opening and thinner than half of a width of the wide opening.

In still other exemplary embodiments, the method further includes removing the gate spacers after forming the plug doped region. An interlayer insulating layer is formed on a resulting structure where the gate spacers have been removed. The interlayer insulating layer is patterned to form a contact hole exposing the plug doped region. A contact plug contacting the plug doped region is formed in the contact hole. A bottom width of the contact hole can be formed to be narrower than the width of the plug doped region.

In other exemplary embodiments of the present invention, methods for fabricating a semiconductor device include simultaneously forming a plug doped region and an n+ doped region. The methods include forming cell gate patterns and peripheral gate patterns in a cell array region and a peripheral circuit region of a semiconductor substrate, respectively. Gate spacers are formed on sidewalls of the cell gate patterns and the peripheral gate patterns. A plug doped region and n+ doped regions are simultaneously formed in a portion of the semiconductor substrate that is located in the cell array region and the peripheral circuit region. The cell gate patterns are formed to define a narrow opening and a wide opening having a wider width than that of the narrow opening. The plug doped region is not formed below the narrow opening but selectively formed in a portion of the semiconductor substrate that is located below the wide opening.

In other exemplary embodiments, the gate spacers are formed to expose a bottom surface of the wide opening and to fill a lower region of the narrow opening. The plug doped region is formed using the gate spacers filling the lower region of the narrow opening as an ion mask. Accordingly, the plug doped region is not formed below the narrow opening but selectively formed in a portion of the semiconductor substrate that is located below the wide opening.

In still other exemplary embodiments, the method further includes removing the gate spacers after forming the plug doped region and n+ doped regions. An interlayer insulating layer is formed on a resulting structure where the gate spacers have been removed. The interlayer insulating layer is patterned to form a contact hole exposing at least the plug doped region and the n+ doped regions. A contact plug contacting at least the plug doped region and the n+ doped regions is formed in the contact hole. A bottom width of the contact hole is formed to be narrower than widths of the plug doped region and the n+ doped regions.

In other exemplary embodiments, the peripheral circuit region includes LVN, HVN, LVP, and HVP regions. The peripheral gate patterns includes LVN, HVN, LVP, and HVP gate patterns disposed on portions of the semiconductor substrate that are located in the LVN, HVN, LVP, and HVP regions. The n+ doped regions are selectively formed in the LVN and HVN regions.

In other exemplary embodiments, the method further includes forming a first photoresist pattern covering the LVP and HVP regions and exposing the cell array region, the LVN and HVN regions after the forming of the cell gate patterns and the peripheral gate patterns. A first ion implantation process that uses the first photoresist pattern, the cell gate patterns, and the peripheral gate patterns as an ion mask is performed to form n-doped regions in portions of the semiconductor substrate that are located at both sides of the cell gate patterns, and the LVN and HVN gate patterns. A second photoresist pattern covering the cell array region, the LVN and HVN regions is formed and at least one of the LVP and HVP regions are exposed. A second ion implantation process that uses the second photoresist pattern, the cell gate patterns, and the peripheral gate patterns as an ion mask is performed to form p− doped regions in portions of the semiconductor substrate that are located at both sides of at least one of the LVP and HVP gate patterns.

In further exemplary embodiments, the forming of the plug doped region and the n+ doped regions include forming a third photoresist pattern covering the LVP and HVP regions and exposing at least one of the cell array region, the LVN region and the HVN region. A third ion implantation process that uses the third photoresist pattern, the cell gate patterns and the peripheral gate patterns as an ion mask is performed. The third photoresist pattern is formed to pass through the gate spacers disposed at both sides of the HVN gate patterns and extend from upper portions of the HVN gate patterns to upper portions of the n− doped regions. The n+ doped regions are spaced a predetermined distance from the HVN gate patterns and the gate spacers adjacent to the HVN gate patterns.

In, still further exemplary embodiments, the method further includes forming a fourth photoresist pattern covering the cell array region, the LVN and HVN regions, and exposing at least one of the LVP and HVP regions after the forming of the gate spacers. A fourth ion implantation process that uses the fourth photoresist pattern, the cell gate pattern, and the peripheral gate pattern as an ion mask is performed to form p+ doped regions in portions of the semiconductor substrate that are located at both sides of the LVP and HVP gate patterns. The fourth photoresist pattern is formed to pass through the gate spacers disposed at both sides of the HVN gate patterns that extend from upper portions of the HVN gate patterns to upper portions of the p− doped regions. The p+ doped regions are spaced a predetermined distance from the HVN gate patterns and the gate spacers adjacent to the HVN gate patterns.

In even further exemplary embodiments, the forming of the cell gate patterns and the peripheral gate patterns include forming a floating gate layer and a gate interlayer insulating layer on the semiconductor substrate. The gate interlayer insulating layer is patterned to expose at least the floating gate layer from the peripheral circuit region. A control gate layer is formed on a resulting structure including the exposed floating gate layer. The control gate layer, the gate interlayer insulating layer, and the floating gate layer are patterned to form the cell gate patterns and the peripheral gate patterns. The cell gate patterns are formed to constitute a cell array of a NOR flash memory.

In further exemplary embodiments, the cell gate patterns are formed to comprise a tunnel insulating layer, a charge storing layer, a blocking insulating layer, and a cell gate electrode sequentially stacked.

BRIEF DESCRIPTION OF THE DRAWINGS

The accompanying figures are included to provide a further understanding of the present disclosure, and are incorporated in and constitute a part of this specification. The drawings illustrate exemplary embodiments of the present invention and, together with the description, serve to explain principles of the present disclosure. In the figures:

FIGS. 3A to 8A are cross-sectional views of a cell array region of a semiconductor device explaining a method for fabricating the semiconductor device according to an exemplary embodiment of the present invention;

FIGS. 3B to 8B are cross-sectional views of an NMOS region of a semiconductor device explaining a method for fabricating the semiconductor device according to an exemplary embodiment of the present invention;

FIGS. 3C to 8C are cross-sectional views of a PMOS region of a semiconductor device explaining a method for fabricating the semiconductor device according to an exemplary embodiment of the present invention;

FIGS. 9A, 9B, 10A, and 10B are cross-sectional views explaining a self-aligned source technology according to an exemplary embodiment of the present invention;

FIG. 11 is a cross-sectional view explaining a low voltage PMOSFET according to another exemplary embodiment of the present invention.

DETAILED DESCRIPTION OF EXEMPLARY EMBODIMENTS

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present.

A method for fabricating a NOR flash memory will be described below as an exemplary embodiment of the present invention in conjunction with the accompanying drawings. However, the present invention is not limited thereto, and the present disclosure can be applied to a method for fabricating a variety of other semiconductor devices.

Figure 1:
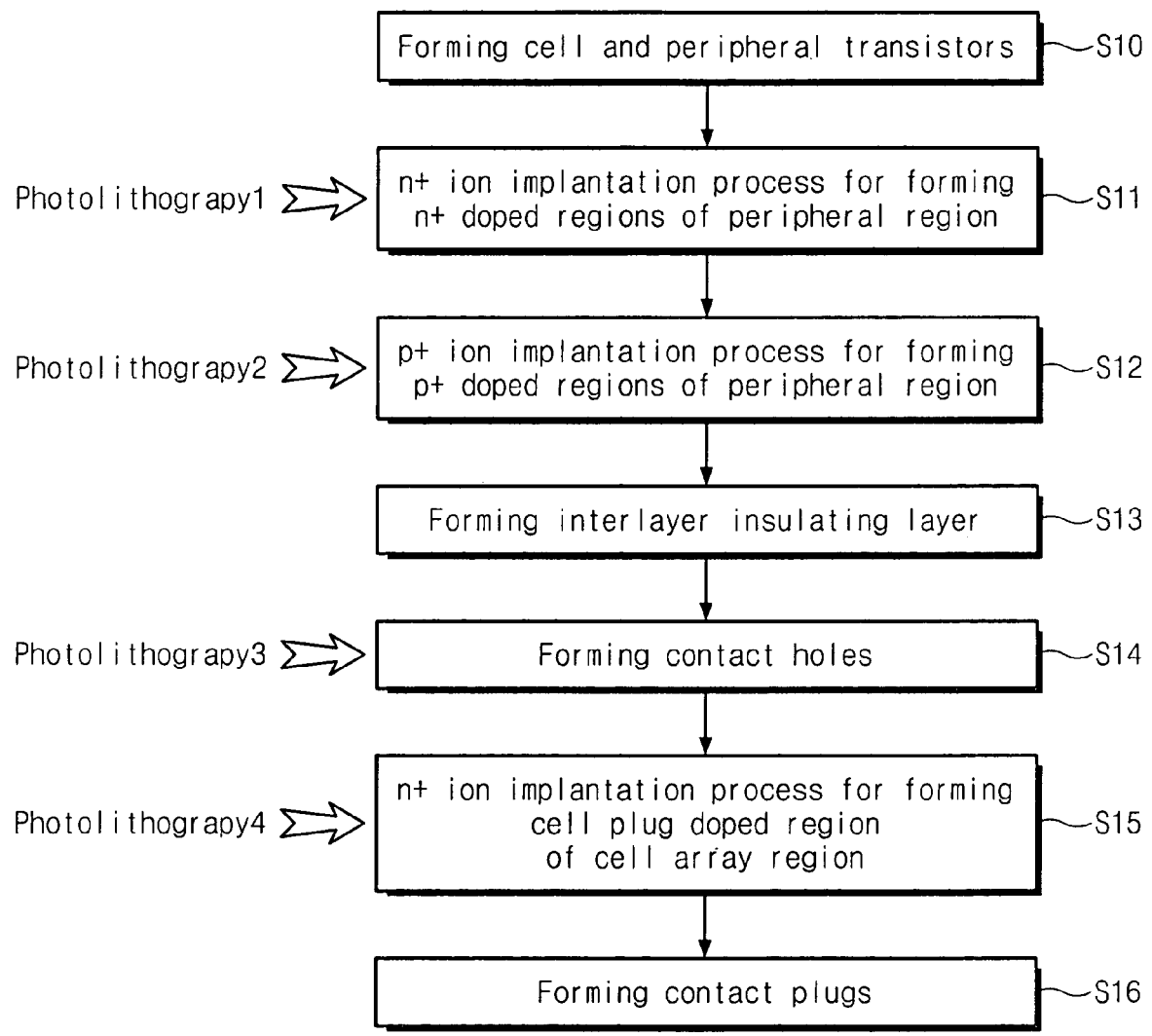
FIG. 1 is a flowchart of a process explaining a method for reducing contact resistance of a contact plug according to a conventional approach.
Figure 2:
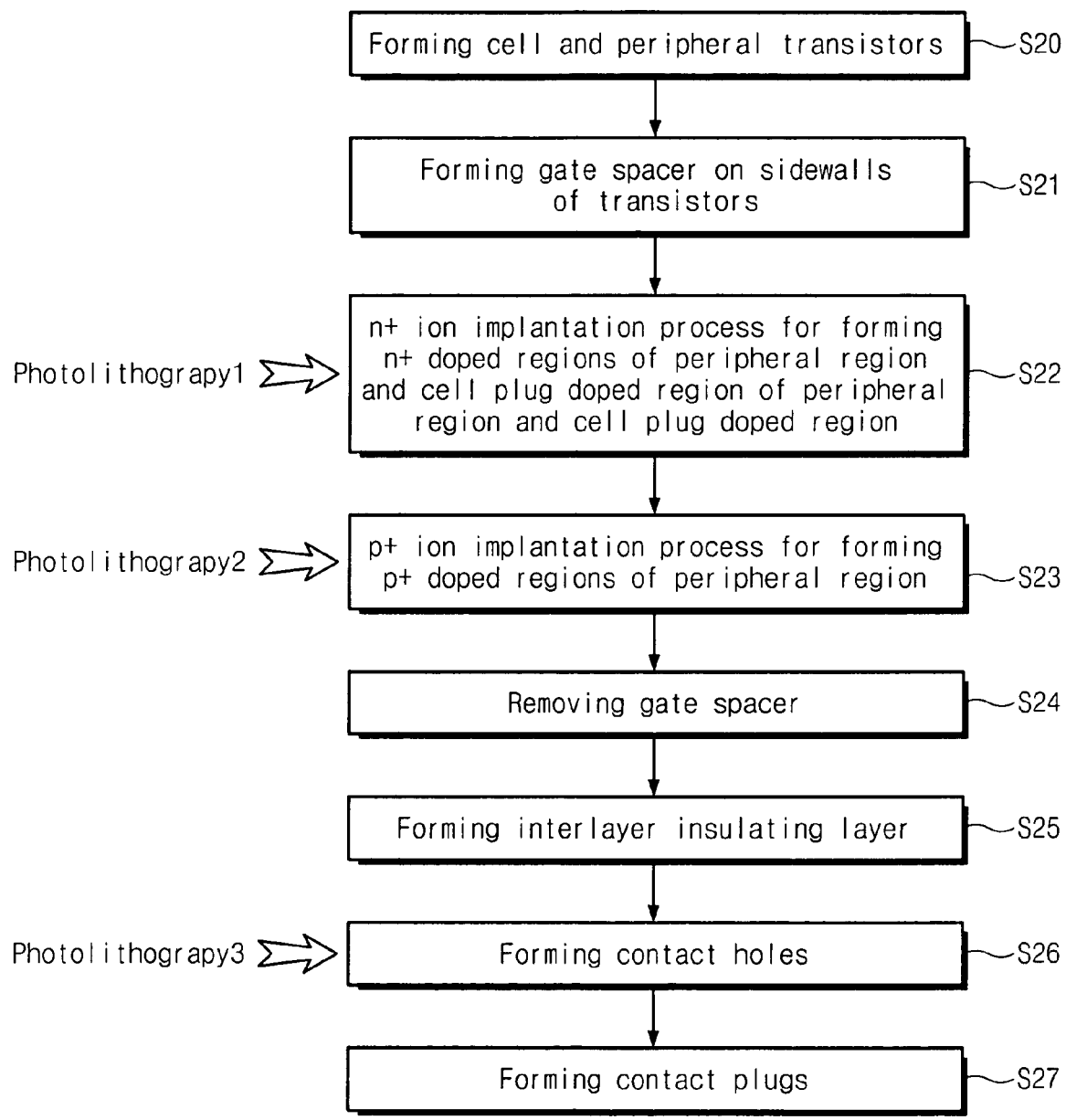
FIG. 2 is a flowchart of a process explaining a method for fabricating a semiconductor device according to an exemplary embodiment of the present invention.
Figure 12:
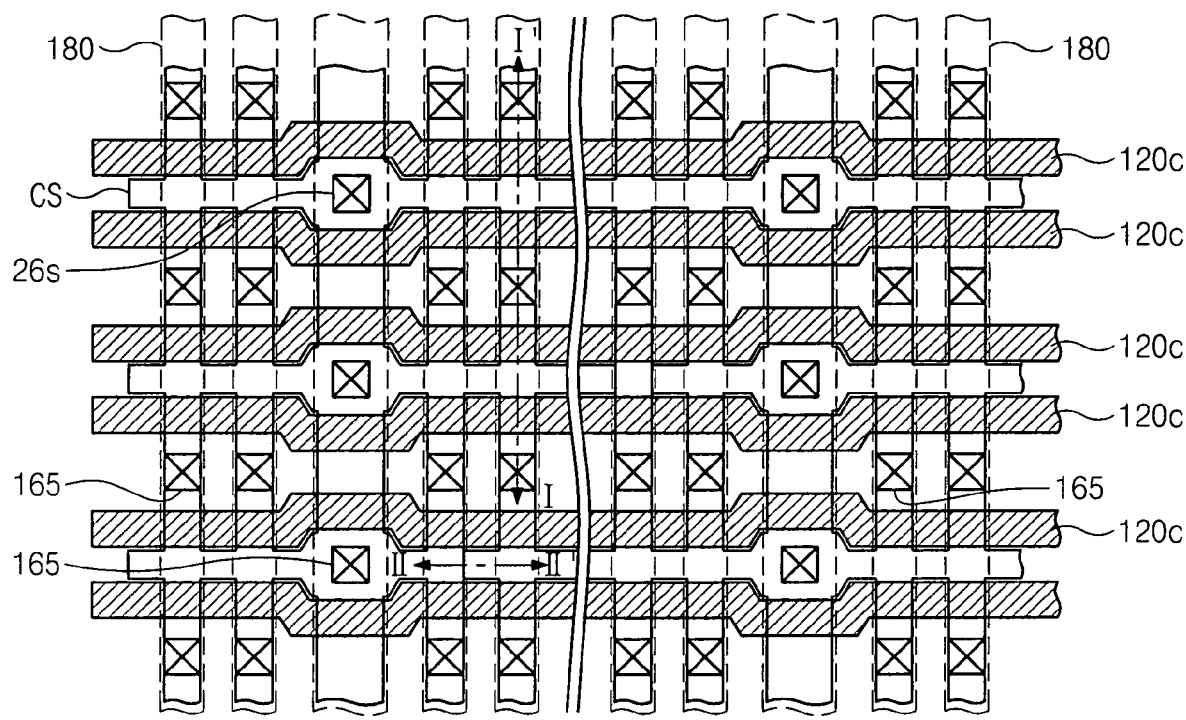
FIG. 12 is a plan view illustrating a portion of a cell array region of a NOR flash memory according to an exemplary embodiment of the present invention.

FIG. 2 is a flowchart of a process explaining a method for fabricating a semiconductor device according to an exemplary embodiment of the present invention. FIGS. 3A to 8A, FIGS. 3B to 8B, and FIGS. 3C to 8C are cross-sectional views of processes explaining a method for fabricating a semiconductor device according to an exemplary embodiment of the present invention. FIG. 12 is a plan view illustrating a portion of a cell array region of a NOR flash memory. In detail, FIG. 3A to FIG. 8A illustrate a cross-section of a cell array region of a NOR flash memory taken along a dotted line I-I' of FIG. 12, FIGS. 3B to 8B illustrate cross-sections of a high voltage NMOSFET and a low voltage NMOSFET disposed in a peripheral circuit region, and FIGS. 3C to 8C illustrate cross-sections of a high voltage PMOSFET and a low voltage PMOSFET disposed in a peripheral circuit region.

Referring to FIGS. 2, 3A to 3C, and 12, cell transistors and peripheral transistors are formed on a semiconductor substrate 100 comprising a cell array region and a peripheral circuit region (Step S20). According to the present exemplary embodiment, the cell transistors have an NMOSFET-based structure, and the peripheral transistors comprise NMOSFETs and PMOSFETs which are disposed in an NMOS region and a PMOS region, respectively. The NMOSFET comprises a high voltage NMOSFET and a low voltage NMOSFET (refer to FIG. 3B), and the PMOSFET comprises a high voltage PMOSFET and a low voltage PMOSFET (refer to FIG. 3C).

In more detail, a step of forming the cell transistors and the peripheral transistors comprises forming a device isolation layer 105 defining active regions in a predetermined region of the semiconductor substrate 100, and forming gate insulating layers and gate patterns on the active regions. The device isolation layer 105 is formed to fill a device isolation trench (101 of FIG. 9B) formed using a general shallow trench technology.

The gate insulating layers comprise a cell gate insulating layer 110c disposed in the cell array region, a high voltage gate insulating layer 110h for the high voltage NMOSFET and a high voltage PMOSFET, and a low voltage gate insulating layer 110l for the low voltage NMOSFET and a low voltage PMOSFET. Generally, the high voltage gate insulating layer 110h is formed in a thickness greater than those of the low voltage gate insulating layer 110l and the cell gate insulating layer 110c.

The gate patterns are disposed in the cell array region and the peripheral circuit region, and comprise cell gate patterns 120c and peripheral gate patterns 120p. A step of forming the cell gate patterns 120c and the peripheral gate patterns 120p comprises sequentially forming a floating gate layer 121, a gate interlayer insulating layer 122, and a control gate layer on the semiconductor substrate 100. The control gate layer can comprise a lower control gate layer 123 and an upper control gate layer 124. According to the present exemplary embodiment, the lower control gate layer 123 can be a polycrystal silicon layer, and the upper control gate layer 124 can be silicide layers and/or metal layers. Also, the floating gate layer 121 can be a polycrystal silicon layer doped with n-type impurities, and the gate interlayer insulating layer 122 can be a silicon oxide layer, a silicon nitride layer, and/or an aluminum oxide layer.

Before the control gate layer is formed, the gate interlayer insulating layer 122 of the peripheral circuit region is patterned to expose an upper surface of the floating gate layer 121 so that the floating gate layer 121 directly contacts the lower control gate layer 123 in the peripheral circuit region. In addition, a capping layer 125 used as an etch mask during a step for forming the gate patterns can be further formed on the control gate layer. Consequently, according to the present exemplary embodiment, the cell gate patterns 120c is comprised of the floating gate layer 121, the gate interlayer insulating layer 122, the lower control gate layer 123, the upper control gate layer 124, and the capping layer 125 sequentially stacked. The peripheral gate patterns 120p are comprised of the floating gate layer 121, the lower control gate layer 123, the upper control gate layer 124, and the capping layer 125 sequentially stacked.

According to another exemplary embodiment of the present invention, the cell gate patterns can comprise a tunnel insulating layer, a charge storing layer, a blocking insulating layer, and a cell gate electrode sequentially stacked (not shown). The tunnel insulating layer can be a silicon oxide layer. The charge storing layer can be a silicon nitride layer. The blocking insulating layer can be formed of a material (such as an aluminum oxide) having a greater dielectric constant than that of the tunnel insulating layer. Also, the cell gate electrode can be a tantalum nitride layer.

Subsequently, low concentration doped regions used as source/drain electrodes of a MOSFET are formed in the semiconductor substrate 100. The low concentration doped regions are formed through an ion implantation process that uses the gate patterns and predetermined photoresist patterns as an ion mask. In more detail, the low concentration doped regions comprise cell n− doped regions 130c and peripheral n− doped regions 130n formed in both sides of the gate patterns of the cell array region and the NMOS region, respectively, and peripheral p− doped regions 130p formed in both sides of the gate patterns of the PMOS region.

Figure 3A:
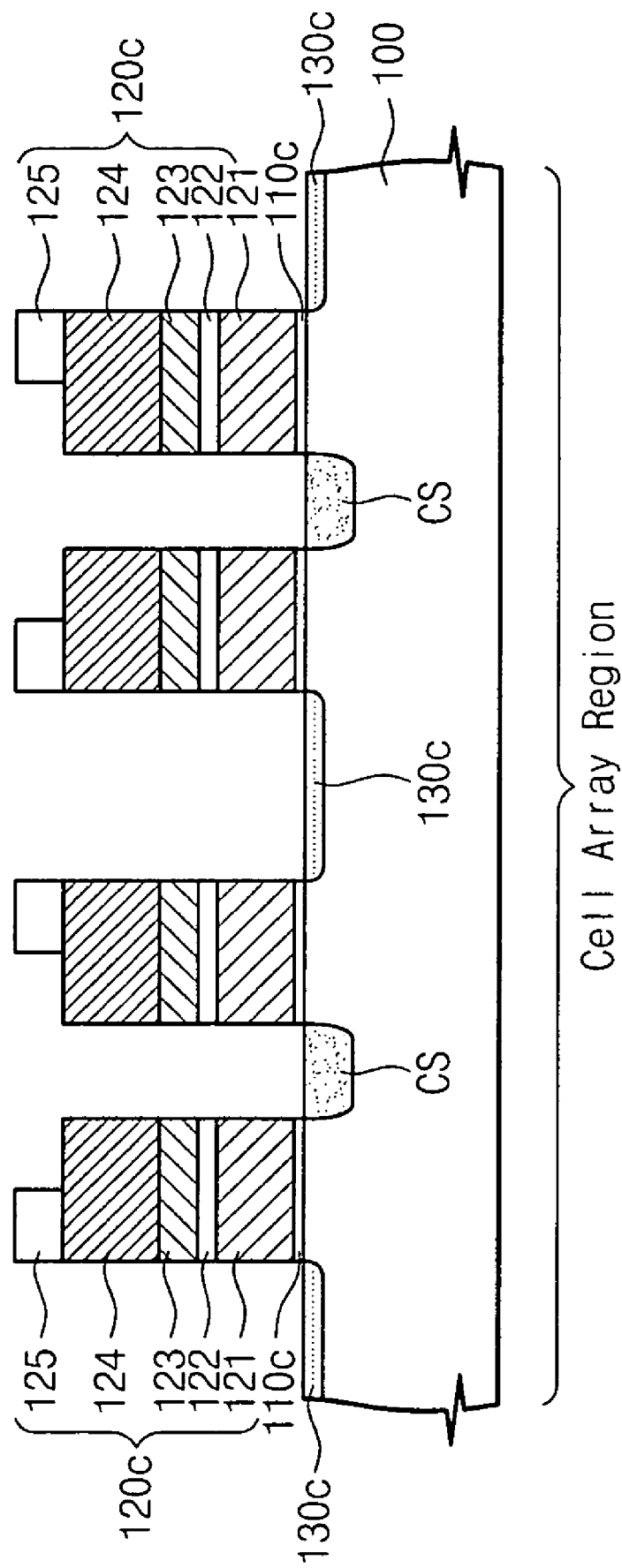
Figure 3C:
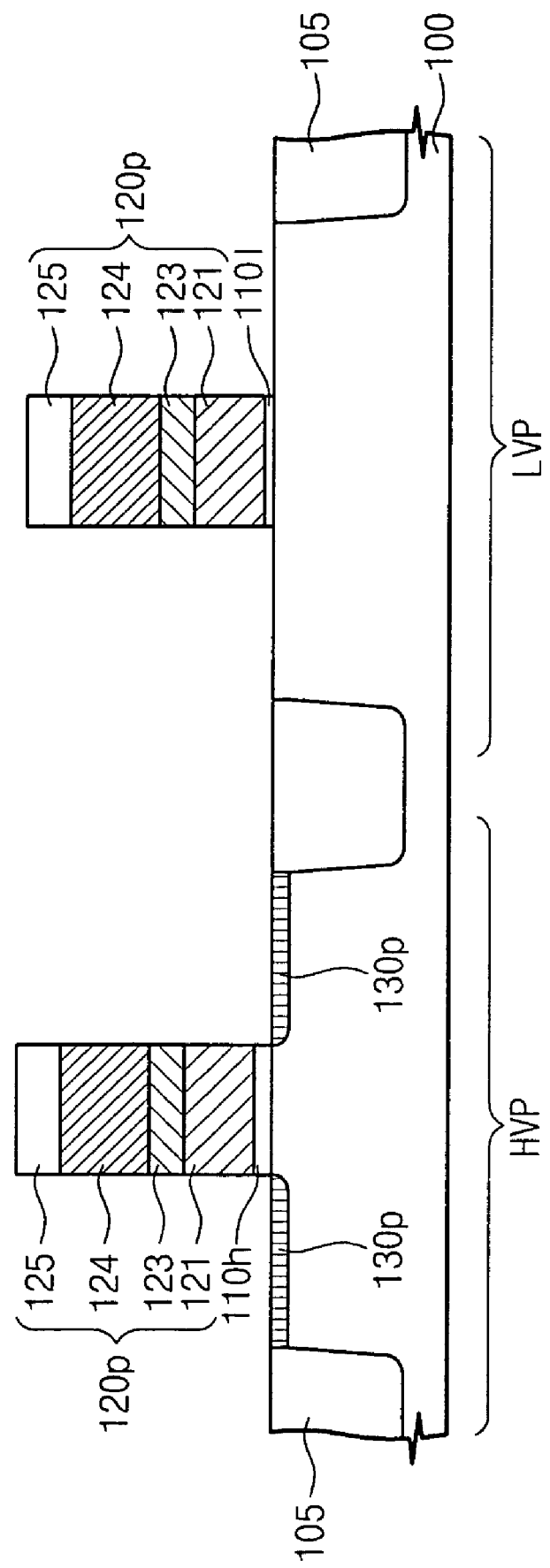

According to an exemplary embodiment of the present invention, referring to FIG. 3C, the high voltage PMOSFET has the peripheral p− doped regions 130p, and the low voltage PMOSFET does not have the peripheral p− doped regions 130p. According to anther exemplary embodiment of the present invention, referring to FIG. 11, both the high voltage PMOSFET and the low voltage PMOSFET can be formed to have the peripheral p− doped regions 130p.

According to an exemplary embodiment of the present invention, referring to FIG. 12, the cell gate patterns 120c are disposed substantially in parallel to each other, and the sidewalls of the cell gate patterns 120c define a narrow opening NO and a wide opening WO in which source electrodes and drain electrodes of cell transistors are disposed, respectively. In more detail, the narrow opening NO and the wide opening WO are formed in an inside and an outside of a pair of the cell gate patterns 120c.

Figure 9A:
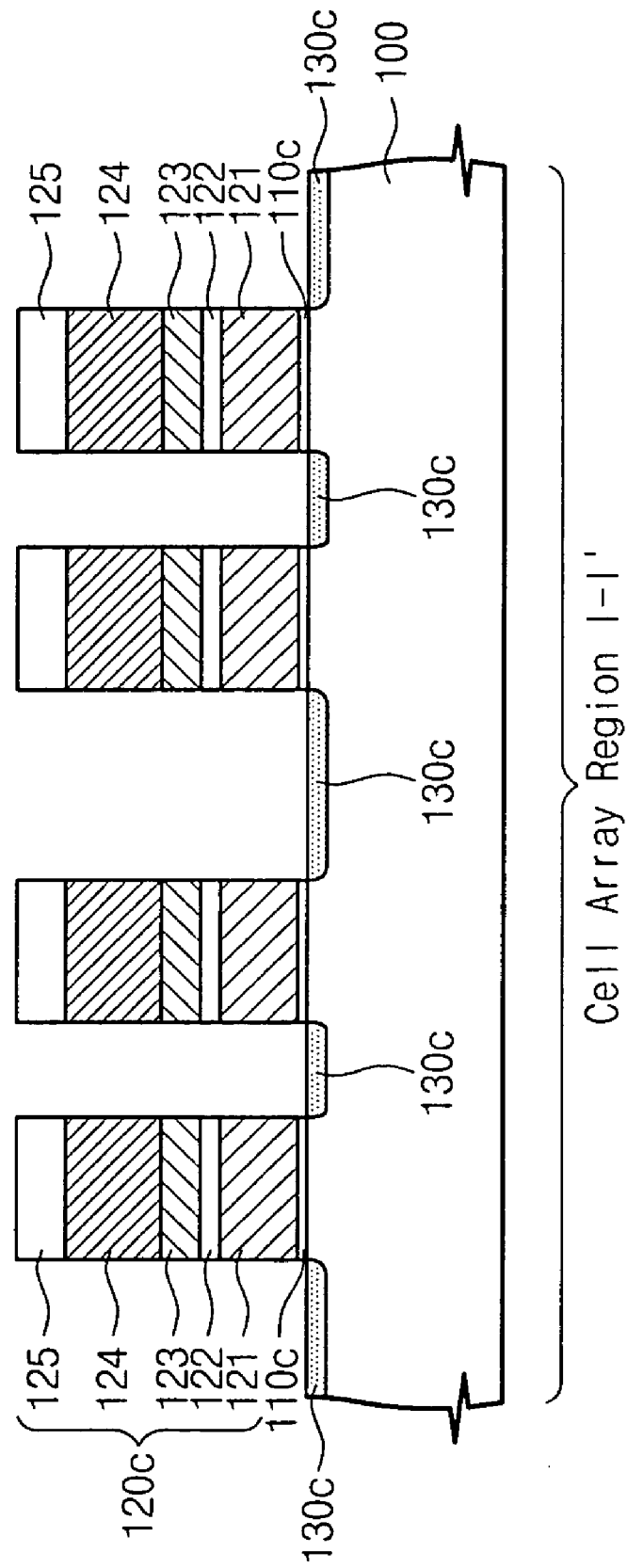
Figure 9B:
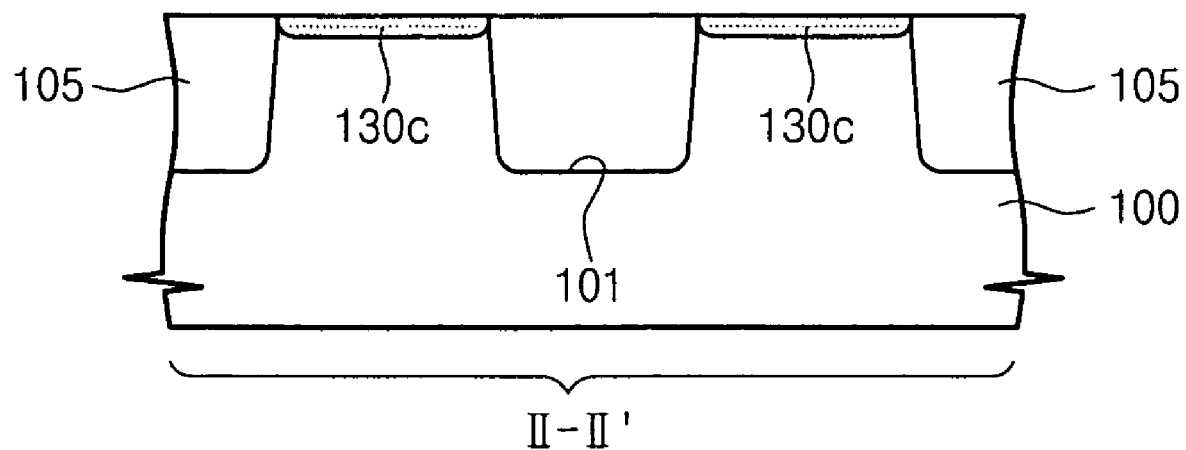
Figure 10B:
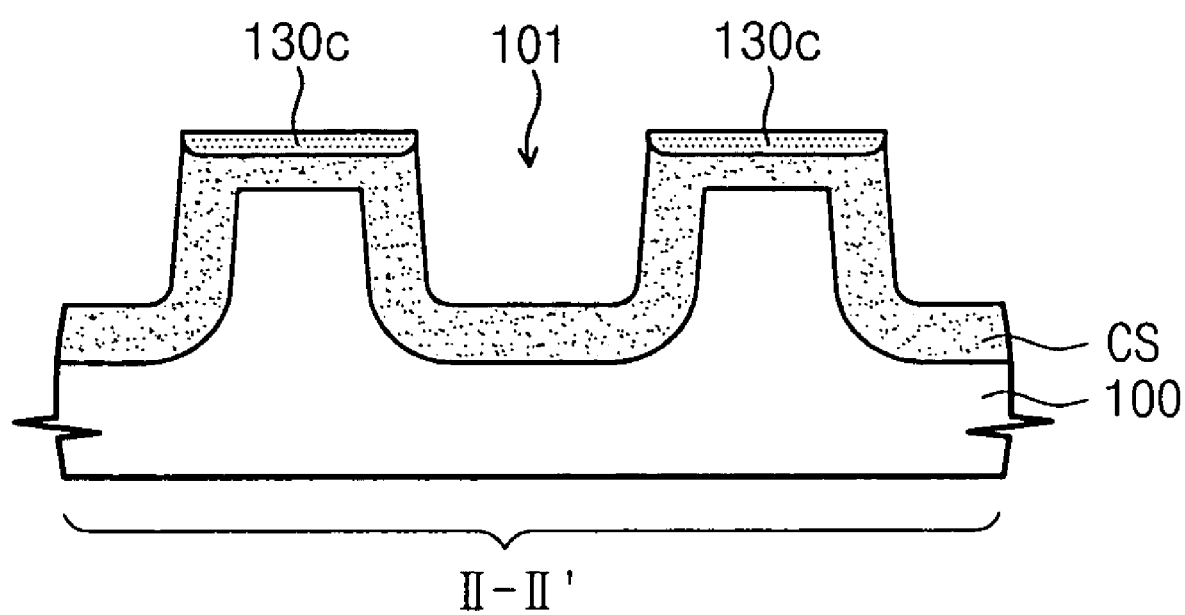

According to an exemplary embodiment of the present invention, a common source line CS electrically connecting the cell n− doped regions 130c can be formed within a portion of an active region that is below the narrow opening NO. The common source line CS can be an n-type doped region formed in the semiconductor substrate 100. The common source line CS can generally be formed using a method known as a self-aligned source (SAS) technology. FIGS. 9A, 9B, 10A, and 10B are cross-sectional views explaining the SAS technology. FIGS. 9A and 10A illustrate a cross-section taken along a dotted line I-I' of FIG. 12. FIGS. 9B and 10B illustrate a cross-section taken along a dotted line II-II' of FIG. 12.

Referring to FIGS. 9A and 9B, as described above, the cell n− doped regions 130c are formed in a portion of the active region that is located between the cell gate patterns 120c. At this point, referring to FIG. 9B, the cell n− doped regions 130c are electrically isolated by the device isolation layer 105.

Referring to FIGS. 10A and 10B, a SAS mask M3 covering the wide opening WO and exposing the narrow opening NO is formed electrically connecting the cell n− doped regions 130c. Subsequently, a portion of the device isolation layer 105 that is located below the narrow opening NO is removed using the SAS mask M3 as an etch mask. Accordingly, an inner wall of the device isolation trench 101 is exposed. After that, the common source line CS is formed along the inner wall of the device isolation trench 101 to electrically connect the cell n− doped regions 130c. The common source line CS can be an n-type doped region formed using an ion implantation process.

Figure 4B:
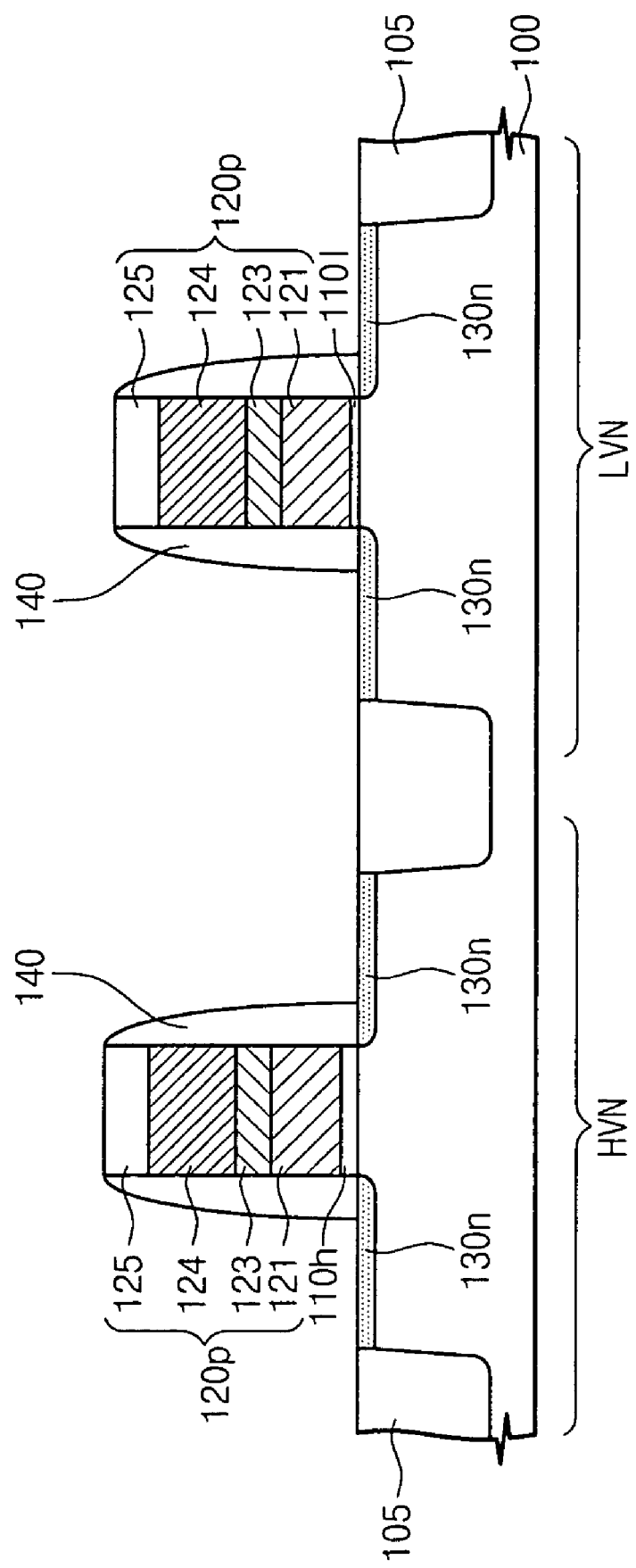
Figure 4C:
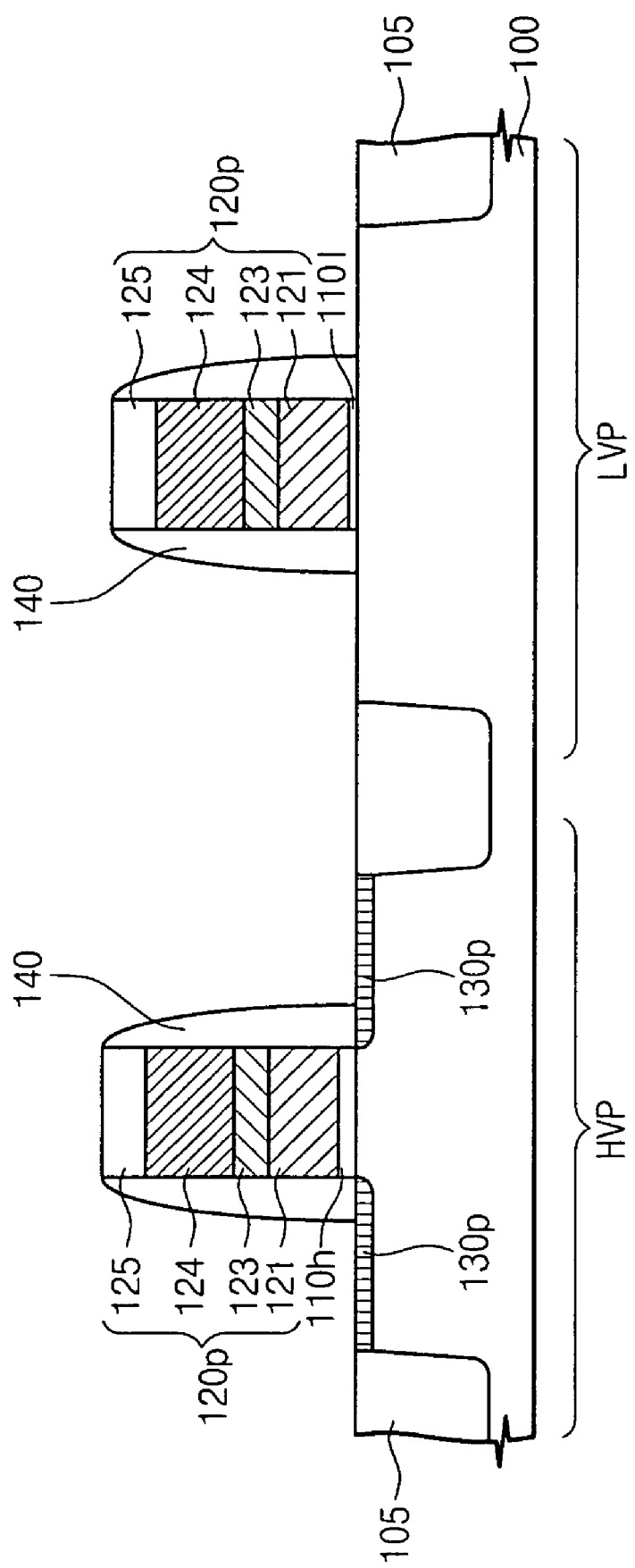
Figure 5C:
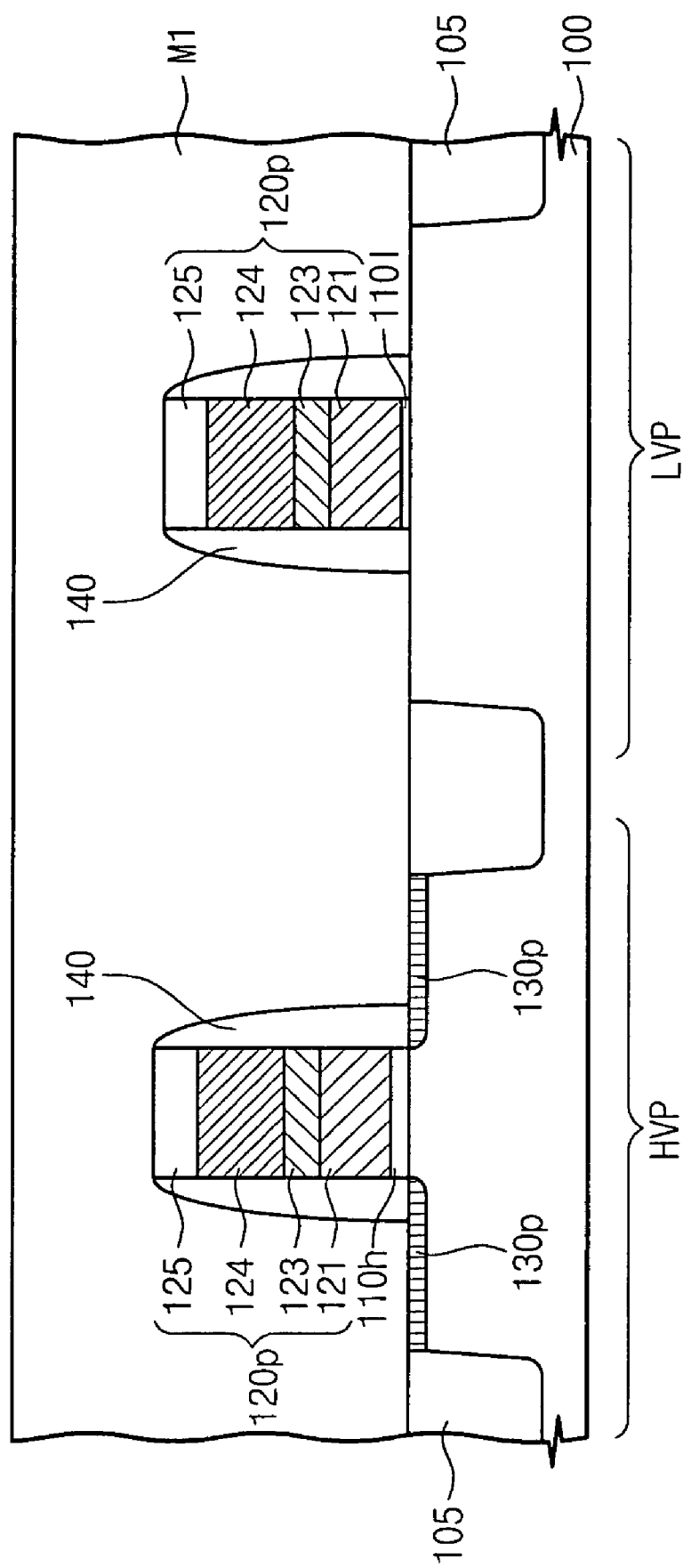

Referring to FIGS. 2, 4A, and 4C, gate spacers 140 are formed on sidewalls of the gate patterns (Step S21). According to an exemplary embodiment of the present inventions the gate spacers 140 are formed to fill at least a lower region of the narrow opening NO of the cell array region and to expose a portion of a lower surface of the wide opening WO.

A step of forming the gate spacers 140 comprises forming a spacer layer on a resulting structure in which the low concentration doped region is formed, and performing anisotropic etching on the spacer layer to expose a bottom surface of the wide opening WO. The spacer layer is formed having a thickness (T of FIG. 5B) thicker than half of a width $S_1$ of the narrow opening NO and thinner than half of a width $S_2$ of the wide opening WO. Consequently, the spacer layer fills the narrow opening NO but does not completely fill the wide opening WO. By the anisotropic etching, the gate spacer 140 can have an upper surface lower than an upper surface of the cell gate patterns 120c at a central portion of the narrow opening NO.

Since an interval between the peripheral gate patterns is sufficiently large, the gate spacers 140 exposes the low concentration doped regions 130n and 130p of the peripheral circuit region. According to an exemplary embodiment of the present invention, the gate spacers 140 can include a silicon nitride layer and/or a silicon oxide layer.

Referring to FIGS. 2, 5A to 5C, a cell plug doped region 150c is formed in a portion of the active region that is located below the wide opening WO, and an n+ doped region 150n is formed in a portion of the active region that is located in the NMOS region (Step S22). According to an exemplary embodiment of the present invention, the cell plug doped region 150c and the n+ doped region 150n are simultaneously formed.

In more detail, a first photoresist pattern M1 covering the PMOS region and exposing the cell array region is formed using a predetermined photolithography process on a resulting structure in which the gate spacers 140 are formed. After that, a first ion implantation process that uses the first photoresist pattern M1 as an ion mask is performed to simultaneously form the cell plug doped region 150c and the n+ doped region 150n.

Since the narrow opening NO (or at least a lower region of the narrow opening NO) in the cell array region is filled with the gate spacer 140, impurities used during the first ion implantation process are not formed in a portion of the active region that is located below the narrow opening NO. Consequently, the cell plug doped region 150c is selectively formed in a portion of the active region that is located below the wide opening WO, which is a region used as a drain electrode of the cell transistor. Also, since the cell plug doped region 150c is formed using the gate spacers 140 self-aligned on sidewalls of the wide opening WO as an ion mask, the cell plug doped region is self-aligned at a central portion of the wide opening WO.

According to an exemplary embodiment of the present invention, the first photoresist pattern M1 can also be formed on the gate patterns (referred to as HVN gate patterns hereinafter) of the high voltage NMOSFET as illustrated in FIG. 5B. In this case, the first photoresist pattern M1 can extend from the HVN gate patterns to an upper surface of the n− doped region while passing through the gate spacers disposed at both sides of the HVN gate patterns. Consequently, referring to FIG. 5B, an interval $L_1$ between the n+ doped region 150n and the HVN gate patterns can be greater than a width T of the gate spacers 140. Since the n+ doped region 150n is aligned with the gate spacer 140 in the case of the low voltage NMOS region, an interval between the n+ doped region 150n and the gate patterns (referred to as NVN gate patterns hereinafter) of the low voltage NMOSFET can be equal to a width T of the gate spacer 140. Lateral diffusion of ions and thermal diffusion by a subsequent heat treatment may reduce an interval between the n+ doped region 150n and the HVN and LVN gate patterns.

According to another exemplary embodiment of the present invention, the cell plug doped region 150c may be formed by using an additional ion implantation step, which is different from the step (Step S22) for forming the n+ doped region 150n. In addition, the peripheral n− doped regions 130n, which is formed in the active region of HVN region, need not be formed under the gate spacer 140 such that it is apart from the HVN gate pattern.

Referring to FIGS. 2, 6A to 6C, a p+ doped region 150p is formed in a portion of the active region that is located in the PMOS region (Step S23). In detail, a second photoresist pattern M2 covering the NMOS region and the cell array region and exposing the PMOS region is formed using a predetermined photolithography process on a resulting structure in which the cell plug doped region 150c and the n+ doped region 150n are formed. After that, a second ion implantation process that uses the second photoresist pattern M2 as an ion mask is performed to form a p+ doped region 150p in a portion of the active region that is located at both sides of gate patterns (referred to as HVP and LVP gate patterns hereinafter) of the high voltage and low voltage PMOSFETs.

Figure 6B:
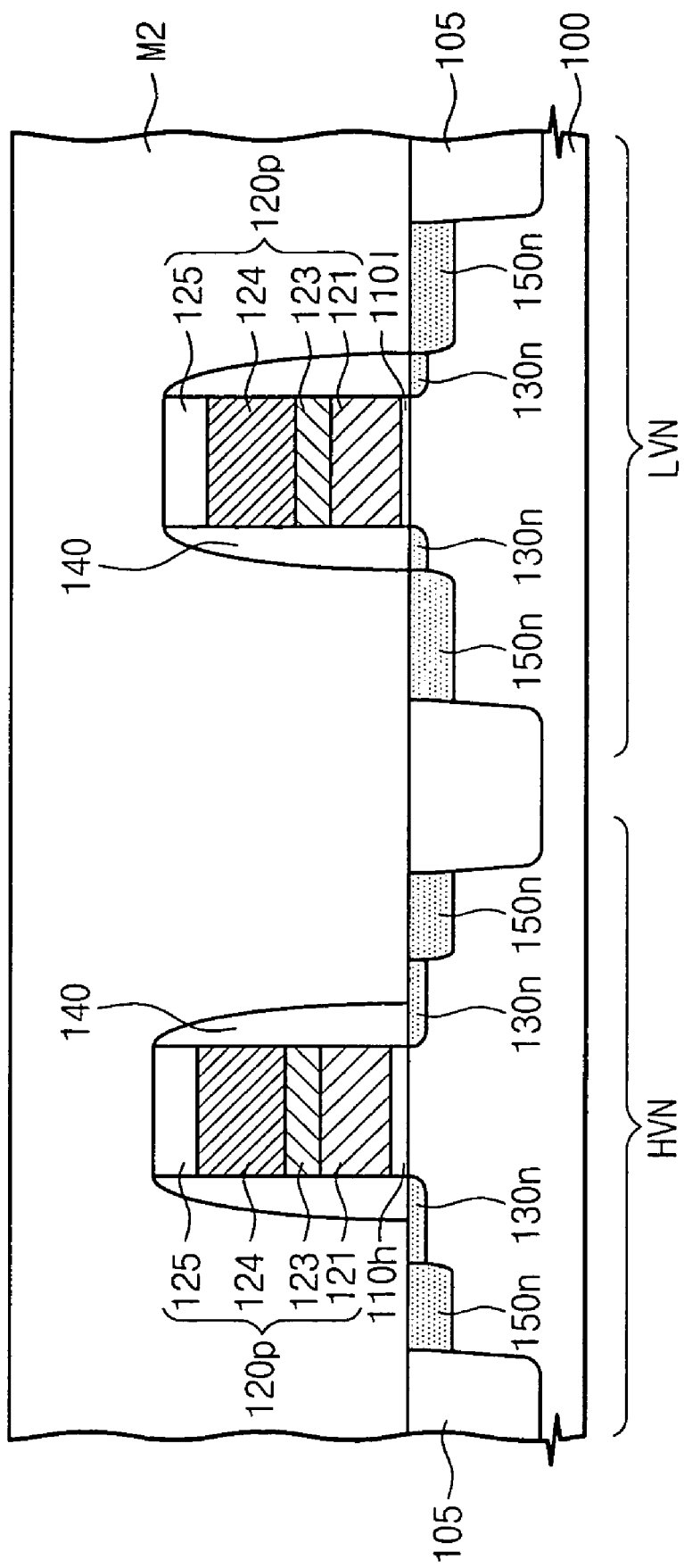
Figure 6C:
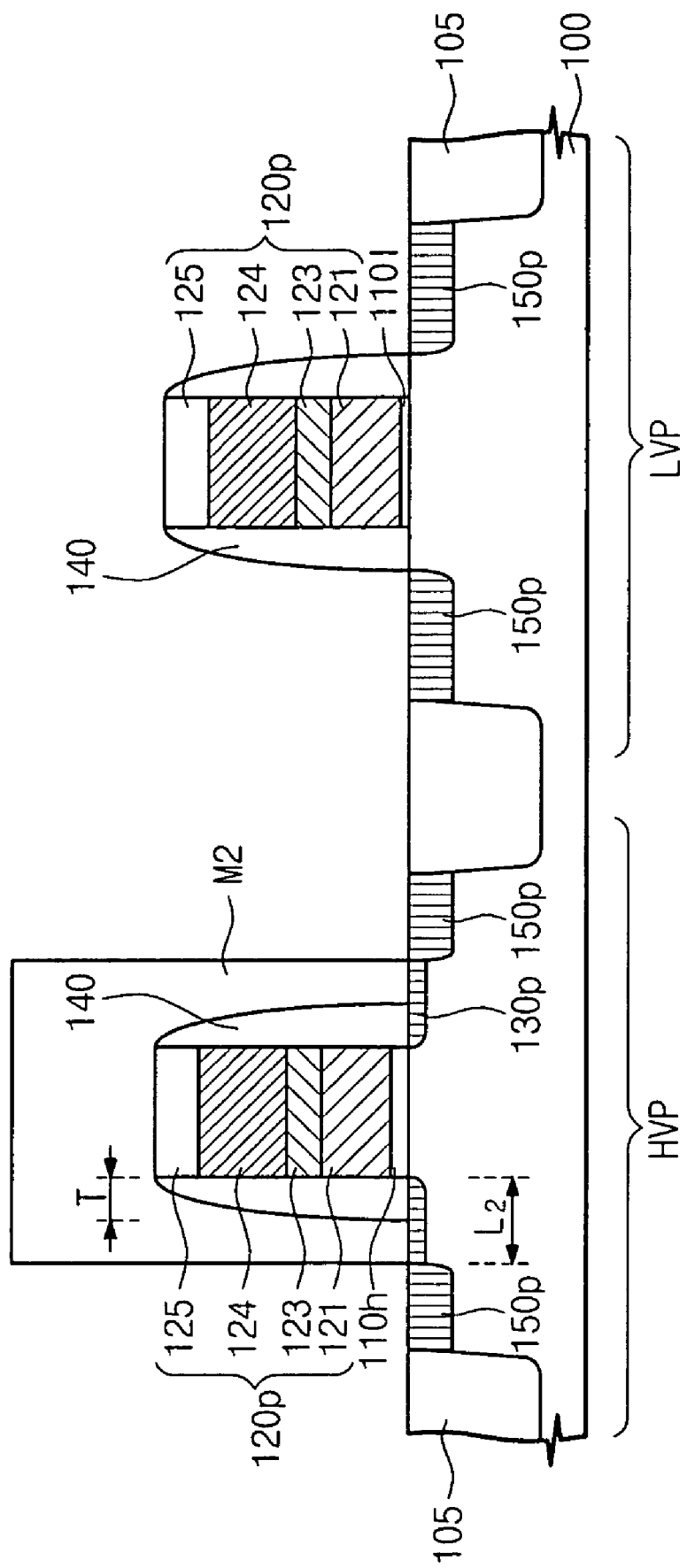
Figure 7A:
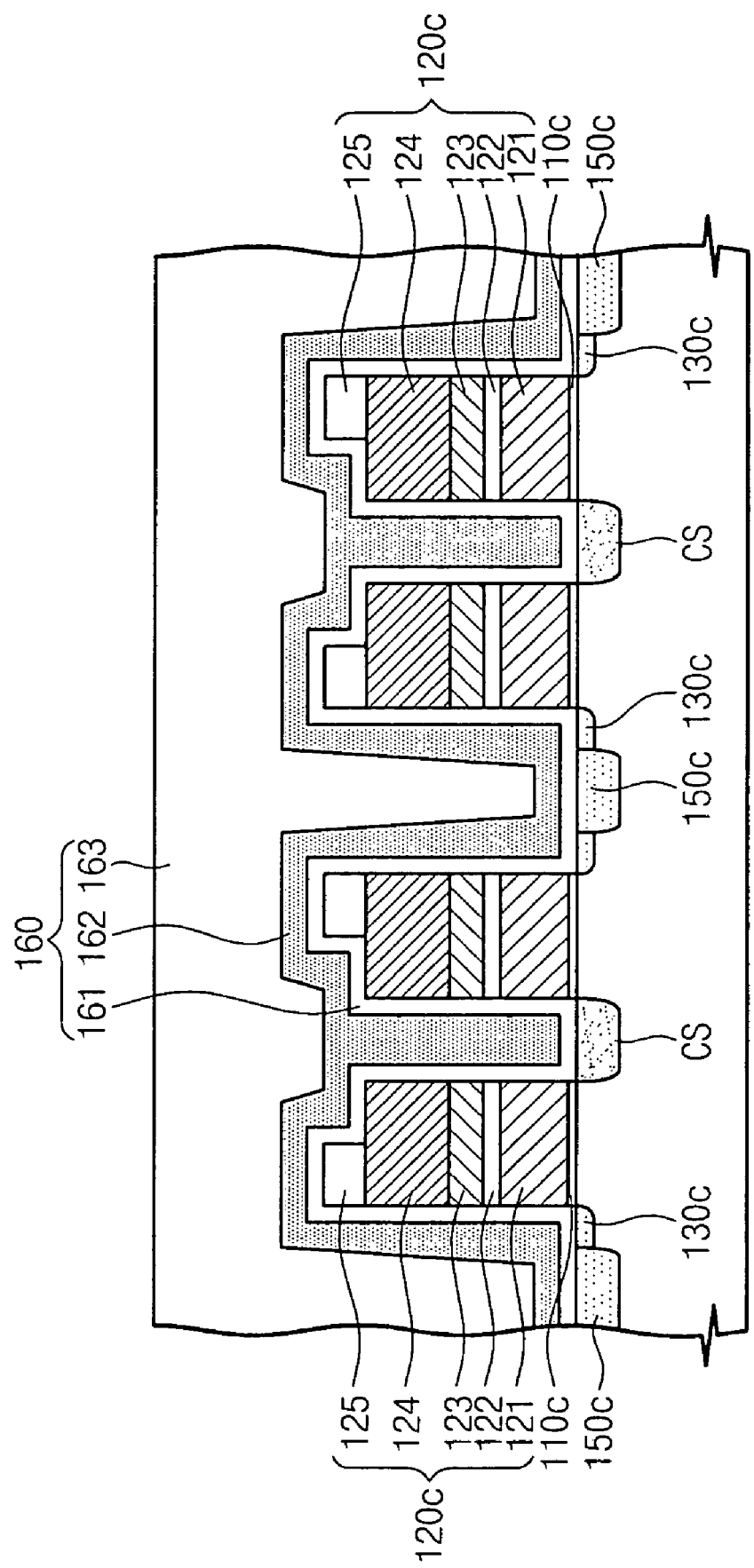
Figure 7B:
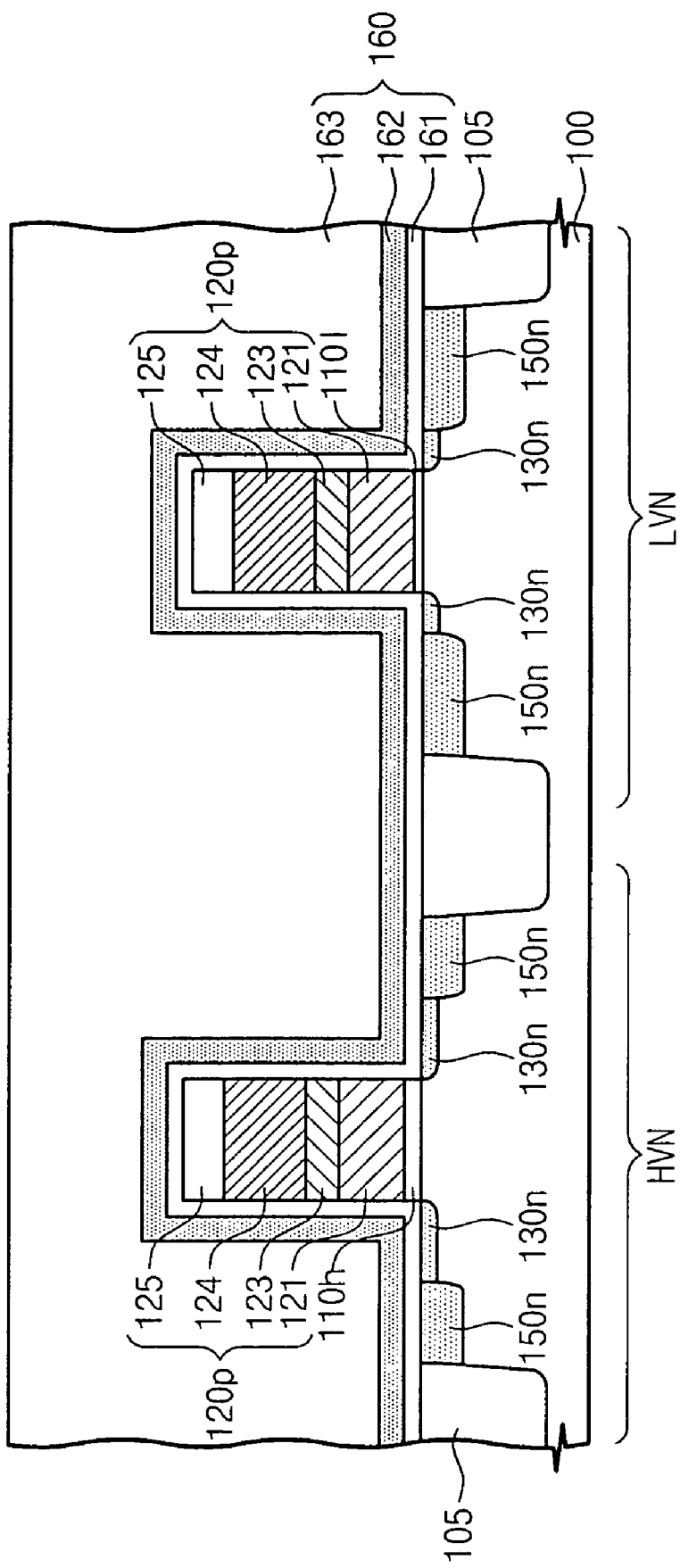
Figure 7C:
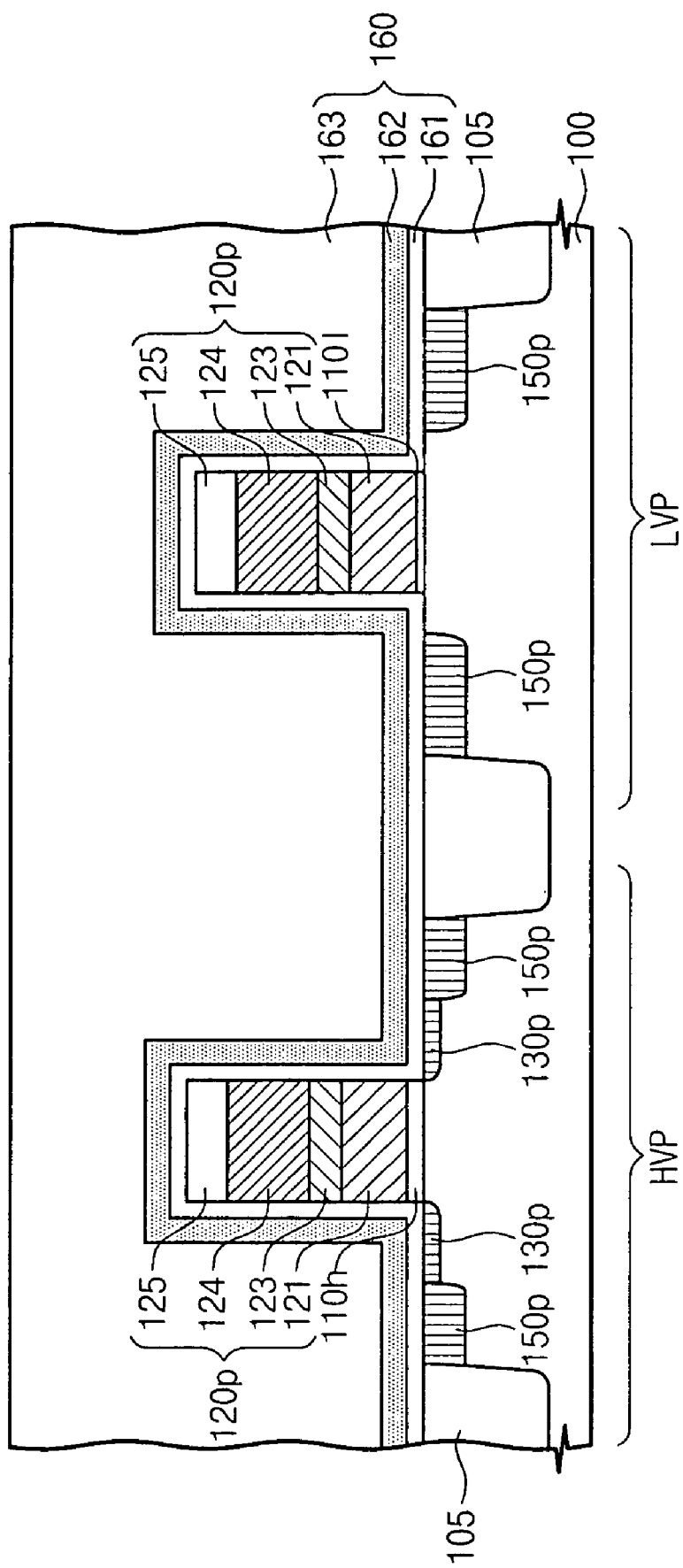
Figure 8B:
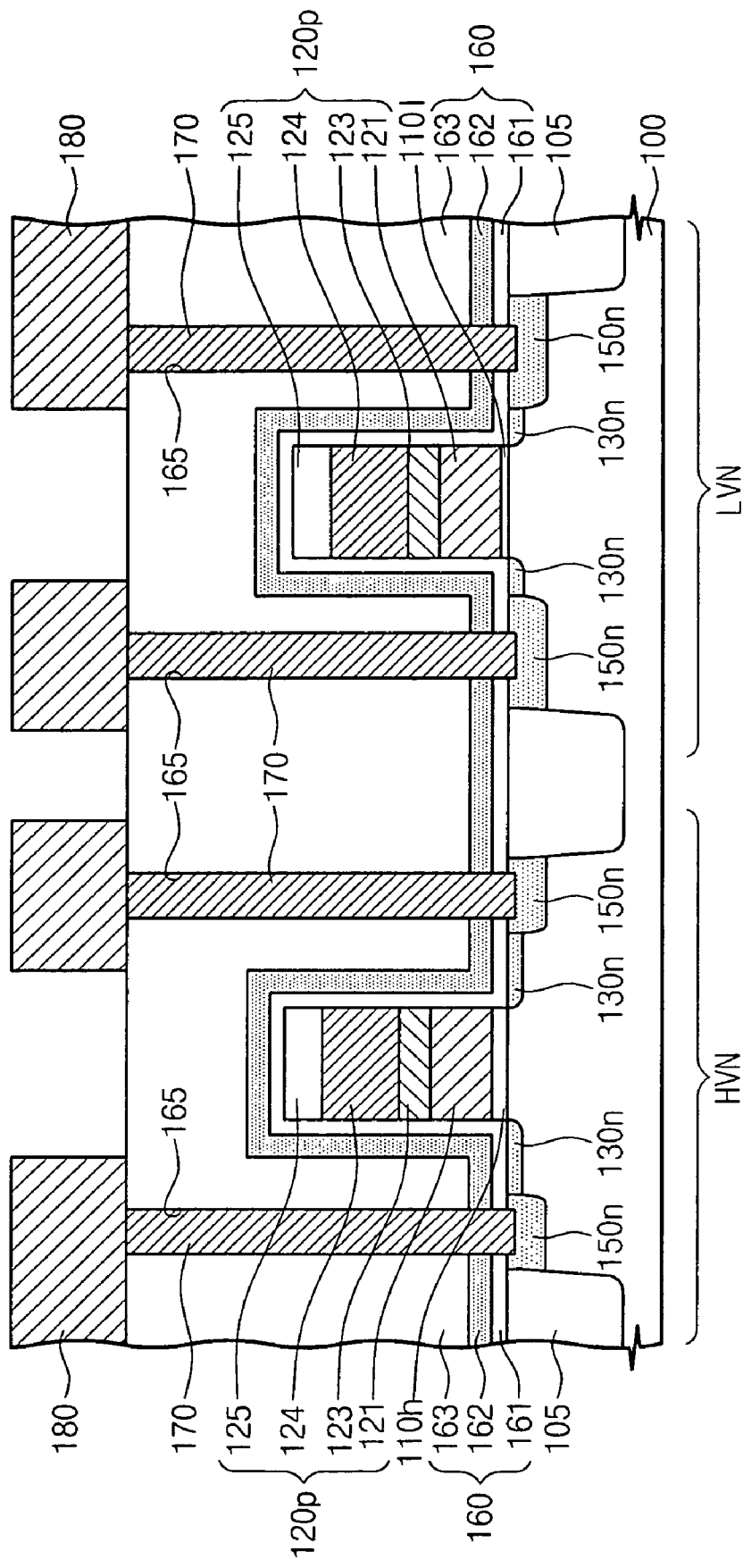
Figure 8C:
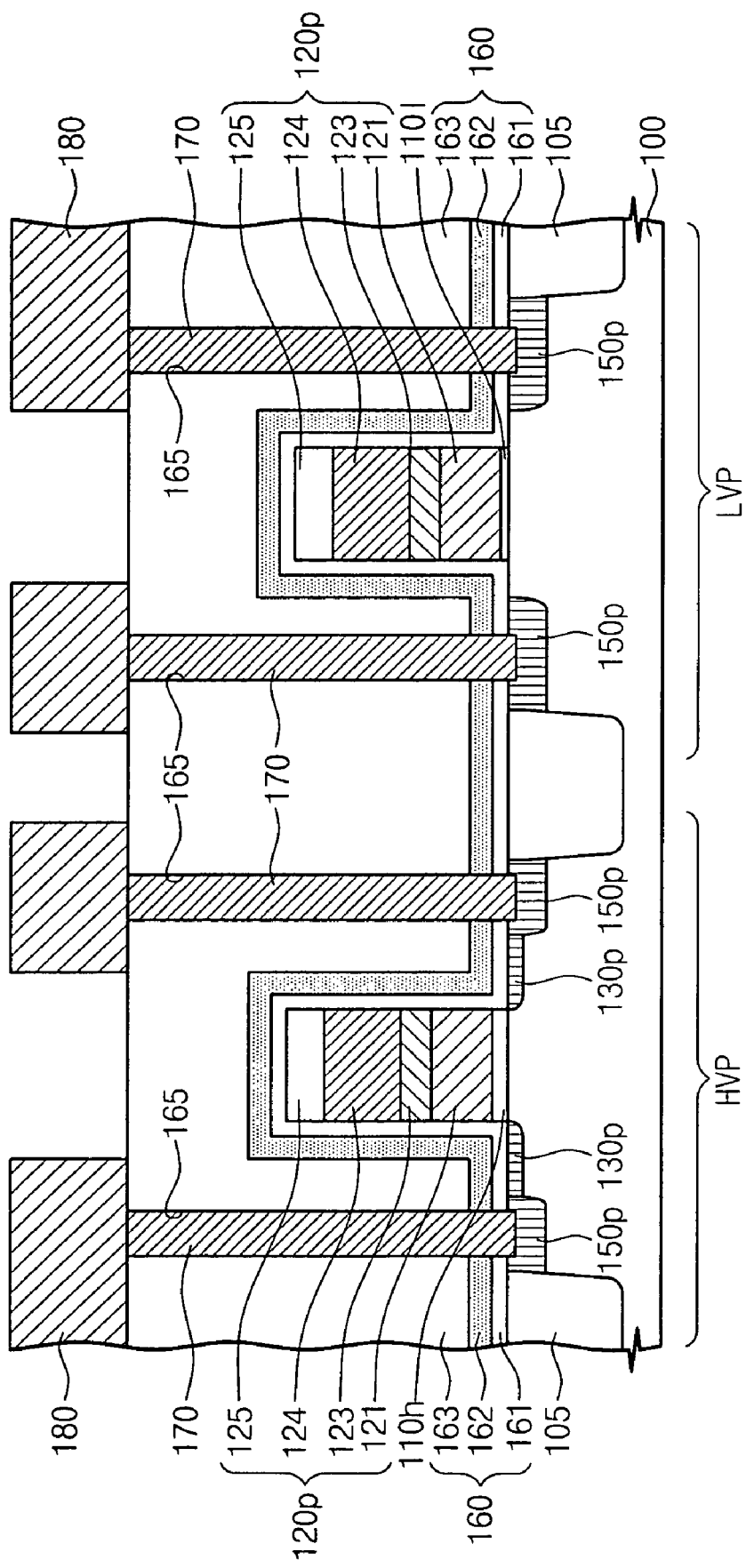

According to an exemplary embodiment of the present invention, the second photoresist pattern M2 can also be formed on the HVP gate patterns as illustrated in FIG. 6C. In this case, the second photoresist pattern M2 can pass through the gate spacers 140 disposed at both sides of the HVP gate patterns, and extend from the HVP gate patterns to an upper surface of the p– doped region. Consequently, referring to FIG. 6C, an interval L2 between the p+ doped region 150p and the HVP gate patterns becomes larger than a width T of the gate spacer 140. In the low voltage PMOS region, the p+ doped region 150p is aligned with the gate spacer 140, so that an interval between the p+ doped region 150p and the LVP gate patterns can be equal to a width T of the gate spacer 140. Lateral diffusion of ions and diffusion by a subsequent heat treatment can reduce an interval between the p+ doped region 150p and the HVN and LVN gate patterns.

Referring to FIGS. 2, 7A to 7C, the gate spacers 140 are removed to expose sidewalls of the gate patterns (Step S24), and an interlayer insulating layer 160 is formed on a resulting structure thereof (Step S25). The interlayer insulating layer 160 can comprise an etch stop layer 162 and an upper insulating layer 163 sequentially stacked.

The etch stop layer 162 is formed to cover a resulting structure in which the gate spacers 140 are removed. The etch stop layer 162 is formed of a material having etching selectivity with respect to the upper insulating layer 163 to prevent etching damage caused by a difference of an etch target depth during a subsequent process of forming a contact hole. According to an exemplary embodiment of the present invention, the etch stop layer 162 can be a silicon nitride layer.

The upper insulating layer 163 can be a silicon oxide layer, a silicon oxide nitride layer, a silicon nitride layer, and/or a low dielectric layer. In addition, according to an exemplary embodiment of the present invention, before the etch stop layer 162 is formed, a lower insulating layer 161 can be further formed on a resulting structure in which the gate spacers 140 are removed. The lower insulating layer 161 can be a silicon oxide layer.

Referring to FIGS. 2, 8A to 8C, contact holes 165 passing through the interlayer insulating layer 160 and exposing electrodes of the cell transistors and the peripheral transistors are formed (Step S26). Subsequently, after contact plugs 170 filling the contact holes 165 are formed (Step S27), local lines 180 disposed on the interlayer insulating layer 160 and connecting to the contact plugs 170 are formed. A step of forming the contact hole 165 comprises performing anisotropic etching on the interlayer insulating layer 160 using the third photoresist pattern (not shown) formed through photolithography as an etch mask.

As described above, as semiconductor devices become highly integrated, a cross-sectional area of the contact holes 165 gradually reduces. Particularly, referring to FIG. 8A, a bottom width W of the contact hole 165 can be narrowed from an upper entry to a lower bottom because of the existence of the etch stop layer 162. This reduction in size can increase contact resistance of the contact plug 170. However, according to an exemplary embodiment of the present invention, the cell plug doped region 150c is formed in a portion of the active region that is located below the wide opening WO in which the contact plug 170 is formed. The cell plug doped region 150c contributes reduction in contact resistance of the contact plug 170. A width of the cell plug doped region 150c in the cell array region may be wider than a bottom width W of the contact hole 165 preventing an increase in contact resistance generated because the contact plug 170 does not completely contact the cell plug doped region 150c.

A fabricating process from a step of forming the transistors to a step of forming the contact plugs according to an exemplary embodiment of the present invention, generally uses three iterations of photolithography. Conventional methods generally require four iterations of photolithography. Consequently, according to an exemplary embodiment of the present invention, a semiconductor device having reduced contact resistance of a contact plug can be manufactured using a reduced number of process steps.

According to an exemplary embodiment of the present invention, a cell plug doped region reducing contact resistance of a contact plug is formed in a cell array region. The cell plug doped region is selectively formed in a desired location using a gate spacer as an ion mask. The gate spacer can be formed using a variety of intervals between cell gate patterns even without a separate photolithography process. In addition, since the gate spacer can be used as an ion mask as described above, the cell plug doped region can be formed simultaneously with an n+ doped region of a peripheral circuit region. This simultaneous forming allows a semiconductor device to be manufactured using a reduced number of photolithography iterations compared to conventional methods.

The above-disclosed subject matter is to be considered illustrative, and not restrictive.

What is claimed is:

1. A method for fabricating a semiconductor device, the method comprising:
    forming gate patterns on a predetermined region of a semiconductor substrate to define a narrow opening and a wide opening;
    forming gate spacers disposed on sidewalls of the gate patterns, exposing a portion of a bottom surface of the wide opening, and filling at least a lower portion of the narrow opening; and
    performing an ion implantation process using the gate patterns and the gate spacers as an ion mask to form a plug doped region in a portion of the semiconductor substrate that is located below the wide opening.

2. The method of claim 1, wherein the gate spacers filling the lower portion of the narrow opening are used as an ion mask during the ion implantation process, so that the plug doped region is selectively formed in a portion of the semiconductor substrate that is located below the wide opening.

3. The method of claim 1, wherein the forming of the gate spacers comprises:
    forming a spacer layer on a resulting structure where the gate patterns have been formed; and
    anisotropically etching the spacer layer until the bottom surface of the wide opening is exposed to form the gate spacers, wherein the spacer layer is formed having a thickness that is thicker than half of a width of the narrow opening and thinner than half of a width of the wide opening.

4. The method of claim 1, further comprising, after forming the plug doped region:
   removing the gate spacers;
   forming an interlayer insulating layer on a resulting structure where the gate spacers have been removed;
   patterning the interlayer insulating layer to form a contact hole exposing the plug doped region; and
   forming a contact plug contacting the plug doped region in the contact hole,
   wherein a bottom width of the contact hole is formed to be narrower than a width of the plug doped region.

5. A method for fabricating a semiconductor device, the method comprising:
   forming cell gate patterns and peripheral gate patterns in a cell array region and a peripheral circuit region of a semiconductor substrate, respectively;
   forming gate spacers on sidewalls of the cell gate patterns and the peripheral gate patterns; and
   simultaneously forming plug doped region and n+ doped regions in the cell array region and the peripheral circuit region of the semiconductor substrate,
   wherein the cell gate patterns are formed to define a narrow opening and a wide opening having a wider width than the narrow opening, and the plug doped region is selectively formed below the wide opening.

6. The method of claim 5, wherein the gate spacers are formed to expose a bottom surface of the wide opening and to fill a lower region of the narrow opening, and the plug doped region is formed using the gate spacers, filling the lower region of the narrow opening, as an ion mask, so that the plug doped region is selectively formed below the wide opening.

7. The method of claim 5, wherein the forming of the gate spacers comprises:
   forming a spacer layer on a resulting structure where the cell gate patterns and the peripheral gate patterns have been formed; and
   anisotropically etching the spacer layer until a bottom surface of the wide opening is exposed to form the gate spacers,
   wherein the spacer layer is formed having a thickness that is thicker than half of a width of the narrow opening and thinner than half of a width of the wide opening such that the gate spacers fill the lower portion of the narrow opening.

8. The method of claim 5 further comprising, after forming the plug doped region and n+ doped regions:
   removing the gate spacers;
   forming an interlayer insulating layer on a resulting structure where the gate spacers have been removed;
   patterning the interlayer insulating layer to form a contact hole exposing at least the plug doped region and the n+ doped regions; and
   forming a contact plug contacting at least the plug doped region and the n+ doped regions in the contact hole,
   wherein a bottom width of the contact hole is formed to be narrower than widths of the plug doped region and the n+ doped regions.

9. The method of claim 5, wherein the peripheral circuit region comprises an LVN (low voltage N-type) region, an HVN (high voltage N-type) region, an LVP (low voltage P-type) region, and an HVP (high voltage P-type) region, and the peripheral gate patterns comprise LVN, HVN, LVP, and HVP gate patterns disposed on the LVN, HVN, LVP, and HVP regions, and the n+ doped regions are selectively formed in the LVN and HVN regions.

10. The method of claim 9, further comprising, after the forming of the cell gate patterns and the peripheral gate patterns:
    forming a first photoresist pattern covering the LVP and HVP regions and exposing the cell array region, and the LVN and HVN regions;
    performing a first ion implantation process that uses the first photoresist pattern, the cell gate patterns, and the peripheral gate patterns as an ion mask to form n– doped regions at two sides of the cell gate patterns, and the LVN and HVN gate patterns;
    forming a second photoresist pattern covering the cell array region, and the LVN and HVN regions and exposing at least one of the LVP or HVP regions; and
    performing a second ion implantation process that uses the second photoresist pattern, the cell gate patterns, and the peripheral gate patterns as an ion mask to form p– doped regions at two sides of at least one of the LVP or HVP gate patterns.

11. The method of claim 10, further comprising, after the forming of the n– doped regions, forming a common source line connecting the n– doped regions that are formed below the narrow opening of the cell array region.

12. The method of claim 10, wherein the forming of the plug doped region and the n+ doped regions comprises:
    forming a third photoresist pattern covering the LVP and HVP regions and exposing at least one of the cell array region, or the LVN and HVN regions; and
    performing a third ion implantation process that uses the third photoresist pattern, the cell gate patterns and the peripheral gate patterns as an ion mask.

13. The method of claim 12, wherein the third photoresist pattern is formed to extend from upper portions of the HVN gate patterns to upper portions of the n– doped regions beyond the gate spacers disposed at two sides of the HVN gate patterns, and
    the n+ doped regions are formed to be apart from the HVN gate patterns and the gate spacers adjacent to the HVN gate patterns.

14. The method of claim 10, further comprising, after the forming of the gate spacers:
    forming a fourth photoresist pattern covering the cell array region, and the LVN and HVN regions, and exposing at least one of the LVP or HVP regions; and
    performing a fourth ion implantation process that uses the fourth photoresist pattern, the cell gate pattern, and the peripheral gate pattern as an ion mask to form p+ doped regions in two sides of the LVP and HVP gate patterns of the semiconductor substrate.

15. The method of claim 14, wherein the fourth photoresist pattern is formed to extend from upper portions of the HVP gate patterns to upper portions of the p– doped regions beyond the gate spacers disposed at two sides of the HVP gate patterns, and
    the p+ doped regions are formed to be apart from the HVP gate patterns and the gate spacers adjacent to the HVP gate patterns.

16. The method of claim 5, wherein the forming of the cell gate patterns and the peripheral gate patterns comprises:
    forming a floating gate layer and a gate interlayer insulating layer on the semiconductor substrate;

patterning the gate interlayer insulating layer to expose at least the floating gate layer from the peripheral circuit region;

forming a control gate layer on a resulting structure having the exposed floating gate layer; and patterning the control gate layer, the gate interlayer insulating layer, and the floating gate layer to form the cell gate patterns and the peripheral gate patterns.

17. The method of claim 5, wherein the cell gate patterns are formed to comprises a cell array of a NOR flash memory.

18. The method of claim 5, wherein the cell gate patterns are formed to comprise a tunnel insulating layer, a charge storing layer, a blocking insulating layer, and a cell gate electrode sequentially stacked.

* * * * *